United States Patent
Ishizuka et al.

(10) Patent No.: US 12,348,209 B2
(45) Date of Patent: Jul. 1, 2025

(54) FILTER, FILTER MODULE, AND ELECTRONIC DEVICE

(71) Applicant: Murata Manufacturing Co., Ltd., Nagaokakyo (JP)

(72) Inventors: Kenichi Ishizuka, Nagaokakyo (JP); Kentaro Mikawa, Nagaokakyo (JP); Satoshi Shigematsu, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 233 days.

(21) Appl. No.: 18/115,115

(22) Filed: Feb. 28, 2023

(65) Prior Publication Data

US 2023/0216466 A1 Jul. 6, 2023

Related U.S. Application Data

(63) Continuation of application No. PCT/JP2021/027682, filed on Jul. 27, 2021.

(30) Foreign Application Priority Data

Sep. 4, 2020 (JP) ................................ 2020-149063

(51) Int. Cl.
*H03H 7/09* (2006.01)
*H03H 1/00* (2006.01)
*H03H 7/01* (2006.01)

(52) U.S. Cl.
CPC ............ *H03H 7/09* (2013.01); *H03H 7/0115* (2013.01); *H03H 7/1708* (2013.01); *H03H 7/1766* (2013.01); *H03H 2001/0085* (2013.01)

(58) Field of Classification Search
CPC . H03H 7/0115; H03H 2001/0085; H03H 7/09
USPC ................................................. 333/175, 185
See application file for complete search history.

(56) References Cited

U.S. PATENT DOCUMENTS

| | | | |
|---|---|---|---|
| 6,998,939 B2* | 2/2006 | Nakayama | H01F 17/0013 336/200 |
| 2006/0145782 A1* | 7/2006 | Liu | H03H 7/463 333/132 |
| 2009/0009267 A1 | 1/2009 | Miyata et al. | |
| 2013/0076454 A1 | 3/2013 | Imamura | |

(Continued)

FOREIGN PATENT DOCUMENTS

| | | |
|---|---|---|
| JP | 602654 Y2 | 1/1985 |
| JP | 2006186621 A | 7/2006 |
| JP | 2013070288 A | 4/2013 |

(Continued)

OTHER PUBLICATIONS

International Search Report in PCT/JP2021/027682, mailed Oct. 19, 2021, 3 pages.

(Continued)

*Primary Examiner* — Rakesh B Patel
(74) *Attorney, Agent, or Firm* — Keating & Bennett, LLP

(57) ABSTRACT

A filter includes a first capacitor connected in series between a first terminal pair and a second terminal pair, a first inductor connected in parallel with the first capacitor, and a second inductor connected in parallel between the first terminal pair and the second terminal pair. The first inductor and the second inductor are magnetically coupled to each other and are differentially connected to each other.

16 Claims, 31 Drawing Sheets

(56) References Cited

U.S. PATENT DOCUMENTS

2013/0328642 A1* 12/2013 Ma .................. H03H 7/0138
333/177
2021/0050837 A1    2/2021  Shigematsu

FOREIGN PATENT DOCUMENTS

| JP | 2020058044 A  | 4/2020  |
| WO | 2006085624 A1 | 8/2006  |
| WO | 2012121038 A1 | 9/2012  |
| WO | 2017199745 A1 | 11/2017 |
| WO | 2018150881 A1 | 8/2018  |
| WO | 2019235261 A1 | 12/2019 |

OTHER PUBLICATIONS

Written Opinion in PCT/JP2021/027682, mailed Oct. 19, 2021, 4 pages.
Office Action in JP2022-546155, mailed Apr. 16, 2024, 3 pages.

* cited by examiner

ANTI-RESONATOR

FILTER, FILTER MODULE, AND ELECTRONIC DEVICE

CROSS REFERENCE TO RELATED APPLICATIONS

This application claims the benefit of priority to Japanese Patent Application No. 2020-149063 filed on Sep. 4, 2020 and is a Continuation Application of PCT Application No. PCT/JP2021/027682 filed on Jul. 27, 2021. The entire contents of each application are hereby incorporated herein by reference.

BACKGROUND OF THE INVENTION

1. Field of the Invention

The present invention relates to a filter including a high frequency filter circuit, a filter module including the filter and another filter, and an electronic device including the filter or the filter module.

2. Description of the Related Art

In Japanese Unexamined Patent Application Publication No. 2020-58044, a high pass filter is illustrated in which a series circuit formed by a plurality of capacitors is connected between input and output terminals, and LC series resonant circuits are formed between ground and connection points where capacitors among the capacitors are connected.

SUMMARY OF THE INVENTION

In the high pass filter circuit described in Japanese Unexamined Patent Application Publication No. 2020-58044, when the circuit is constituted as a filter serving as an actual structural element, parasitic capacitances are generated in parallel with a plurality of inductors of the LC series circuits in a respective manner. Thus, each inductor self resonates at a certain frequency due to this parasitic capacitance, and passage is suppressed in a frequency band higher than this self resonant frequency. That is, the high pass filter turns into a high pass filter that cannot be used in a high frequency band or a high pass filter that has a narrow pass band.

In contrast, in recent uses, filters have tended to be needed that allow passage with low insertion loss over a wide band. For example, in a filter that allows the frequency band of a high frequency wide band such as the 5th Generation (5G) band or the ultra wide band (UWB) to pass therethrough, a filter is required that allows a communication signal of such a high frequency band to pass therethrough with low insertion loss.

Preferred embodiments of the present invention provide filters each with a low insertion loss characteristic even in a higher frequency band, filter modules each including the filter and another filter, and electronic devices each including the filter or the filter module.

A filter as an example of the present disclosure includes a first capacitor connected in series between a first terminal pair and a second terminal pair, a first inductor connected in parallel with the first capacitor, and a second inductor connected in parallel between the first terminal pair and the second terminal pair. The first inductor and the second inductor are magnetically coupled to each other and are differentially connected to each other.

With the above-described configuration, since the first capacitor is connected in parallel with the first inductor, the parasitic capacitance of the first inductor connected in parallel with the first capacitor, so that degradation of bandpass characteristics in a high frequency band due to the presence of the parasitic capacitance of the first inductor is avoided.

A filter module as an example of the present disclosure includes the filter according to an example of the present disclosure described above.

An electronic device as an example of the present disclosure includes the filter or the filter module according to the examples of the present disclosure described above.

According to preferred embodiments of the present invention, filters each with a low insertion loss characteristic even in a higher frequency band, filter modules each including the filter and another filter, and electronic devices including the filters or the filter modules are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
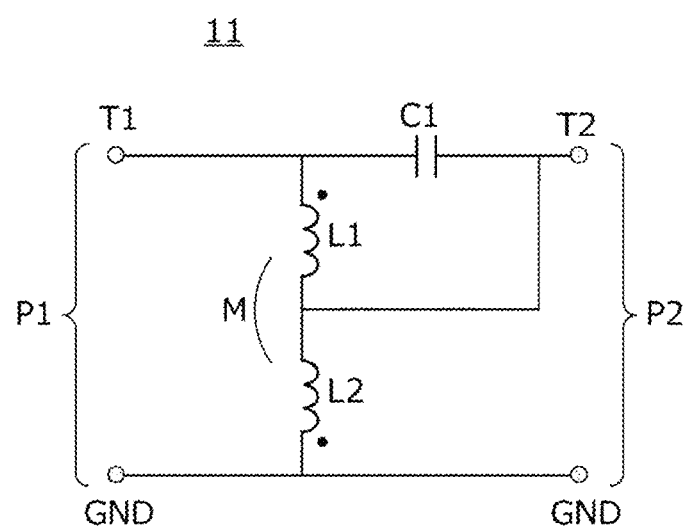
FIG. 1 is a circuit diagram of a high pass filter 11 according to a first preferred embodiment of the present invention.

Hereinafter, a plurality of preferred embodiments of the present invention will be illustrated by describing some specific examples with reference to the drawings. The same portions in the drawings are denoted by the same reference symbols. For the sake of convenience, the preferred embodiments are separately described by taking ease of description or understanding of main points into consideration. However, the configurations of different preferred embodiments among the preferred embodiments can be partially replaced with each other or combined. In second and subsequent preferred embodiments, the description of things common to a first preferred embodiment is omitted and only the points that differ from those of the first preferred embodiment will be described. In particular, substantially the same operational effects due to substantially the same configurations are not mentioned in every preferred embodiment.

First Preferred Embodiment

FIG. 1 is a circuit diagram of a high pass filter 11 according to the first preferred embodiment. The high pass filter 11 is an example of a "filter" according to a preferred embodiment of the present invention.

The high pass filter 11 is a two-port network (a four-terminal network) including a first terminal pair P1 and a second terminal pair P2. The first terminal pair P1 includes a first terminal T1 and a ground terminal GND. The second terminal pair P2 includes a second terminal T2 and a ground terminal GND.

The high pass filter 11 includes a first capacitor C1, a first inductor L1, and a second inductor L2. The first capacitor C1 is connected in series between the first terminal pair P1 and the second terminal pair P2. The first inductor L1 is connected in parallel with the first capacitor C1. The second inductor L2 is connected in parallel between the first terminal pair P1 and the second terminal pair P2. The first inductor L1 and the second inductor L2 are magnetically coupled to each other and are differentially connected to each other.

Figure 2A:
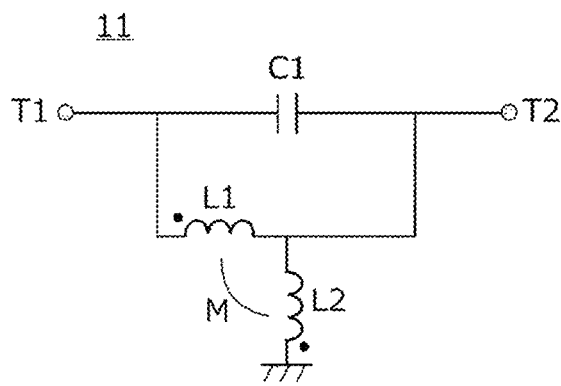
FIGS. 2A to 2D are circuit diagrams obtained by changing, in a sequential manner, the illustration form of the high pass filter 11 illustrated in FIG. 1.

FIGS. 2A to 2D are circuit diagrams obtained by changing, in a sequential manner, the illustration form of the high pass filter 11 illustrated in FIG. 1. FIG. 2A is a circuit diagram obtained by changing the illustration form of the high pass filter 11 illustrated in FIG. 1.

Figure 2B:
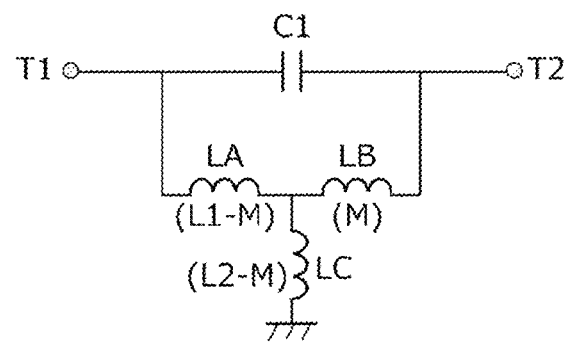

FIG. 2B is an equivalent circuit diagram in which a mutual inductance M caused by the magnetic coupling between the first inductor L1 and the second inductor L2 is expressed as a circuit element. As illustrated in FIG. 2B, when a circuit connected between the first terminal 11 and the second terminal T2 is expressed as a T equivalent circuit including inductors LA, LB, and LC, the inductor LB, which expresses the mutual inductance M, is connected between the second terminal T2 and a connection point where the series connected inductors LA and LC are connected to each other. Since the first inductor L1 and the second inductor L2 are differentially connected to each other, the inductance of the inductor LA is (L1−M), the inductance of the inductor LB is M, and the inductance of the inductor LC is (L2−M). A coupling coefficient between the first inductor L1 and the second inductor L2 is, for example, greater than or equal to about 0.2. In this case, when the inductance of the first inductor L1 is denoted by L1, the inductance of the second inductor L2 is denoted by L2, and the coupling coefficient is denoted by k, $M=k\sqrt{(L1 \cdot L2)}$, and thus M≥about $0.2\sqrt{(L1 \cdot L2)}$. The coupling coefficient between the first inductor L1 and the second inductor L2 is, for example, less than or equal to about 0.8.

Figure 2C:
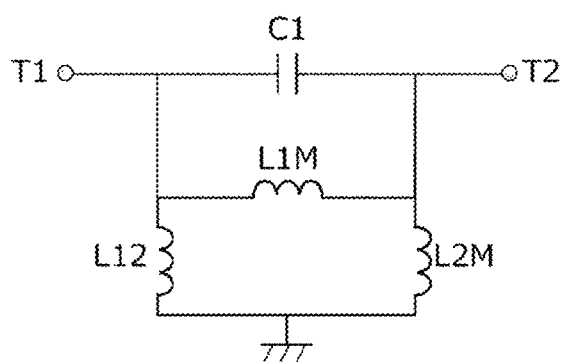

FIG. 2C is a circuit diagram obtained by converting, into a π circuit, the T circuit illustrated in FIG. 2B and including the inductors LA, LB, and LC. That is, the T circuit including the inductors LA, LB, and LC is expressed as a π circuit including inductors L12, L1M, and L2M. When the reference symbols of the inductors denote the inductances of the inductors, the relationships between the inductances of the individual inductors before and after the circuit is converted are as follows.

Figure 2D:
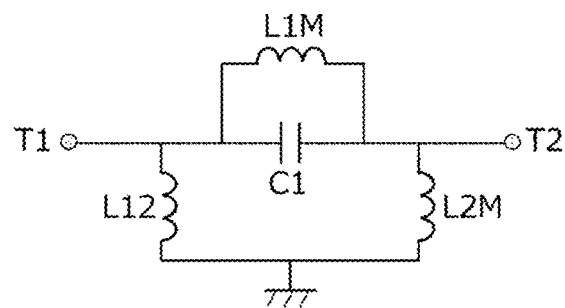

$L1M = (LA \cdot LB + LB \cdot LC + LC \cdot LA)/LC$ $L2M = (LA \cdot LB + LB \cdot LC + LC \cdot LA)/LA$ $L12 = (LA \cdot LB + LB \cdot LC + LC \cdot LA)/LB$ FIG. 2D is a circuit diagram obtained by changing the illustration form of FIG. 2C. In this manner, the high pass filter 11 illustrated in FIG. 1 can be expressed as a 3-stage π high pass filter illustrated in FIG. 2D.

According to the present preferred embodiment, the following operational effects are obtained.

As illustrated in FIG. 2A, since the first inductor L1 and the first capacitor C1 are connected in parallel, the parasitic capacitance generated in the first inductor L1 is connected in parallel with (is acquired by) the first capacitor C1. Thus, the parasitic capacitance generated in the first inductor L1 is effectively used, and bandpass characteristics in a high frequency band do not degrade due to self-resonance of the first inductor L1.

Since the parasitic capacitance of the first inductor L1 can become part of the first capacitor C1, space can be saved accordingly. This enables downsizing. Alternatively, the extra space resulting from downsizing enables the line width of a coiled conductor of the first inductor L1 and that of the second inductor L2 to be increased or the coiled conductor of the first inductor L1 and that of the second inductor L2 to be wound in a parallel manner, thus increasing the Q factors of the inductors. This further increases the Q factor of the filter, so that insertion loss in the pass band can be further reduced, or attenuation in the stop band can be made deeper.

Since the mutual inductance generated due to the magnetic coupling between the first inductor L1 and the second inductor L2 serves as one circuit element, a high pass filter according to the present preferred embodiment is equivalent to a 3-stage π high pass filter in which an attenuation pole is generated at the second stage. In a general 3-stage π high pass filter, two inductors are present that are connected in parallel between the first terminal pair and the second terminal pair. Thus, parasitic capacitances are generated at these two locations (in parallel with L12 and L2M in FIG. 2D in a respective manner), and the bandpass characteristics in the high frequency band may be degraded. In contrast, in the present preferred embodiment, one of the inductors is formed using the mutual inductance, and thus there is only one inductor (the second inductor L2) for which parasitic capacitance becomes a problem. That is, in the equivalent circuit illustrated in FIG. 2D, a parasitic capacitance is not generated in parallel with the inductor L12 but is generated in parallel with the inductor L2M. Thus, degradation of the bandpass characteristics can be reduced or prevented in the high frequency band.

Moreover, since the coupling coefficient is greater than or equal to about 0.2, a lossless mutual inductance increases in the filter circuit. Thus, even in a case where an equivalent series resistance (ESR) of a connection line and so forth is taken into consideration, an inductor having a significantly high Q factor can be provided, so that insertion loss in the pass band can be further reduced, or attenuation in the stop band can be made deeper. Moreover, the inductors do not need to be excessively spaced apart from each other. Thus, downsizing can be achieved by saving space, or the Q factors of the inductors can be increased, for example, by increasing the line widths of the coiled conductors or parallel winding the coiled conductors.

When the coupling coefficient is less than or equal to about 0.8, for example, a reduction in the total equivalent inductance $(L1+L2-k\sqrt{(L1 \times L2)})$ through differential connection can be reduced. Thus, it becomes easier to ensure an inductance having a necessary magnitude, and an excessive space is unnecessary. As a result, downsizing is achieved or the Q factors of the inductors are increased. Furthermore, it is desirable that the coupling coefficient be less than about 0.5, for example. When the coupling coefficient is less than about 0.5, for example, it becomes easier to cause the inductances of the inductors LA, LB, and LC to have larger differences from each other in the equivalent circuit (FIG. 2B). The total inductance (L1M+L2M+L12) of the post-conversion equivalent circuit (FIG. 2D) can be further increased. Thus, it becomes easier to ensure an inductance having a necessary magnitude, and an excessive space is unnecessary. As a result, downsizing is achieved or the Q factors of the inductors are increased. Moreover, it becomes possible to keep a sufficient distance between the first inductor L1 and the second inductor L2, so that degradation of the bandpass characteristics in the high frequency band due to the parasitic capacitance between the inductors can be suppressed, and degradation of the Q factors of the inductors due to eddy-current loss can be reduced or prevented.

As illustrated in FIG. 2B, the inductors connected in a T shape are used as a basic configuration. Thus, compared with a case where the inductors connected in a π shape are used, for example, the inductance is reduced or the number of inductor elements is reduced by using a mutual inductance. Thus, use of the inductors connected in the T shape leads to downsizing or improved filter characteristics due to the increased Q factors of the inductors. (Insertion loss in the pass band is reduced, and attenuation in the stop band becomes deeper.)

By using a mutual inductance to form a portion of the equivalent circuit where a high Q factor is necessary, insertion loss in the pass band can be reduced, and attenuation in the stop band can be made deeper.

In the following, methods for determining the first inductor L1, the second inductor L2, and the coupling coefficient k will be described.

Method 1: Structural Determination Method

The shapes of electrodes of the internal inductors are confirmed through, for example, X-ray imaging or cross-sectioning, and each of the first inductor L1, the second inductor L2, and the mutual inductance M is calculated from the shapes of the electrodes of the inductors using Neumann's formula or other methods. Moreover, the coupling coefficient k is also calculated.

Alternatively, the shapes of the electrodes of the inductors are reproduced through a structure simulation, L1, L2, and M are obtained through numerical calculation from the distribution of current (or a vector potential, a magnetic field, magnetic flux) or network parameters (for example, an S parameter or a Z parameter) at the terminal pairs, and k is also calculated.

Method 2: Determination Method from Electrical Characteristics Measurable at Terminals L1, L2, and M are obtained, using a network analyzer, from the network parameters at the terminal pairs, and k is also calculated.

Alternatively, L1, L2, and M are obtained, using for example an impedance analyzer or an LCR meter, from input impedances between the terminals, and k is also calculated. In this case, it is desirable that measurements be performed at low frequencies (on the order of 100 MHz to 1 GHz) in order to avoid the effect of parasitic capacitance on the measurement system. (Note that when the frequency is too low, measurements cannot be performed because the impedances become too low.)

Second Preferred Embodiment

In a second preferred embodiment, an example of a high pass filter including a third inductor will be illustrated.

Figure 3A:
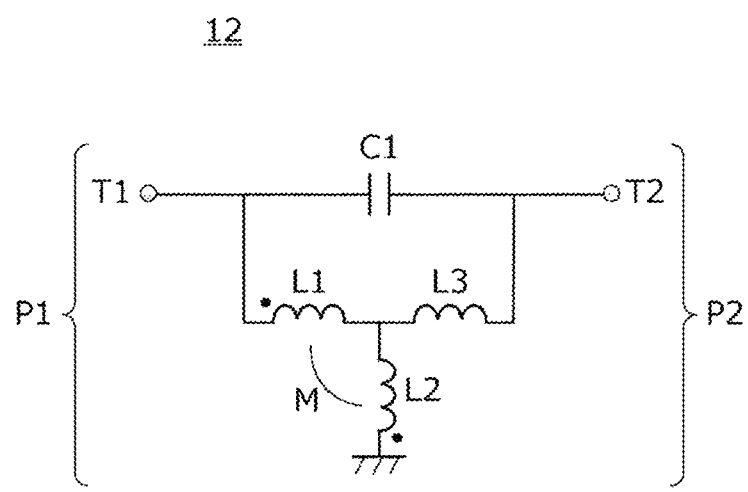
FIG. 3A is a circuit diagram of a high pass filter 12 according to a second preferred embodiment of the present invention.
Figure 3B:
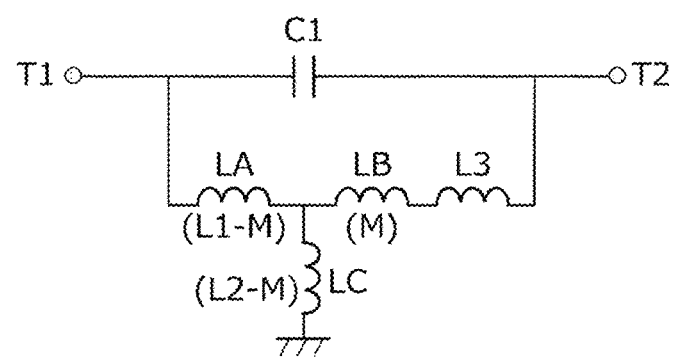
FIG. 3B is an equivalent circuit diagram in which a mutual inductance caused by magnetic coupling between a first inductor L1 and a second inductor L2 is expressed as a circuit element.

FIG. 3A is a circuit diagram of a high pass filter 12 according to the second preferred embodiment. FIG. 3B is an equivalent circuit diagram in which a mutual inductance M caused by the magnetic coupling between the first inductor L1 and the second inductor L2 is expressed as a circuit element.

The high pass filter 12 includes the first capacitor C1, the first inductor L1, and a third inductor L3. The first capacitor C1 is connected in series between the first terminal pair P1 and the second terminal pair P2. The first inductor L1 is connected in parallel with the first capacitor C1. An end of the second inductor L2 is connected between the first terminal pair P1 and the second terminal pair P2. The third inductor L3 and the first inductor L1 define a series circuit, and this series circuit is connected in series between the first terminal pair P1 and the second terminal pair P2. The first inductor L1 and the second inductor L2 are magnetically coupled to each other and are differentially connected to each other.

As illustrated in FIG. 3B, when a circuit including the first inductor L1 and the second inductor L2 is expressed as a T equivalent circuit including the inductors LA, LB, and LC, the inductor LB, which expresses the mutual inductance M, is connected between the second terminal T2 and a connection point where the series connected inductors LA and LC are connected to each other. Since the first inductor L1 and the second inductor L2 are differentially connected to each other, the inductance of the inductor LA is (L1−M), the inductance of the inductor LB is M, and the inductance of the inductor LC is (L2−M).

In this manner, the third inductor L3 is equivalently connected in series with the inductor LB. As a result, the level of balance between the Q factors of the inductors LA, LB+L3, and LC can be freely determined, and a filter having desired filter characteristics can be configured. On the basis of this configuration, characteristics of the high pass filter may be determined.

Third Preferred Embodiment

In a third preferred embodiment, an example of a 4-stage high pass filter will be illustrated.

Figure 4:
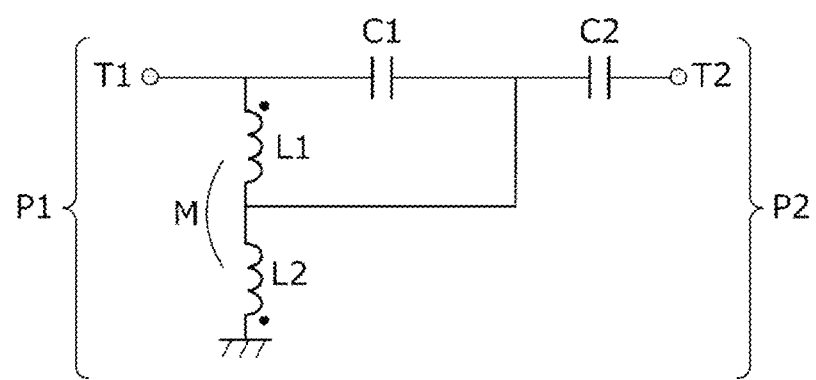
FIG. 4 is a circuit diagram of a high pass filter 13 according to a third preferred embodiment of the present invention.
Figure 5A:
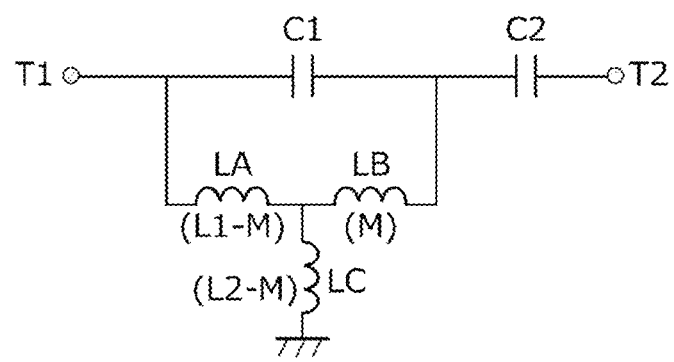
FIGS. 5A and 5B are equivalent circuit diagrams of the high pass filter 13.
Figure 5B:
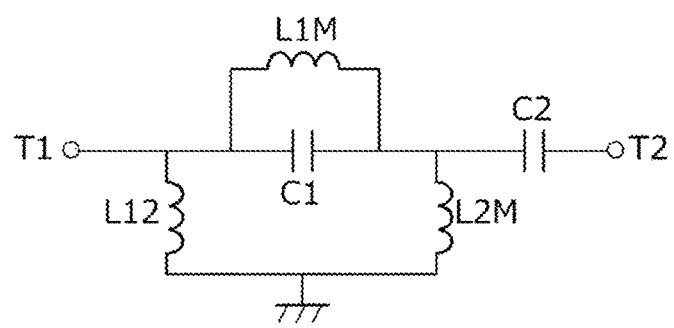

FIG. 4 is a circuit diagram of a high pass filter 13 according to the third preferred embodiment. The high pass filter 13 includes the first capacitor C1, the first inductor L1, the second inductor L2, and a second capacitor C2. The first capacitor C1 is connected in series between the first terminal pair P1 and the second terminal pair P2. The first inductor L1 is connected in parallel with the first capacitor C1. The second inductor L2 is connected in parallel between the first terminal pair P1 and the second terminal pair P2. The second capacitor C2 is connected between the second terminal pair P2 and the first capacitor C1. The first inductor L1 and the second inductor L2 are magnetically coupled to each other and are differentially connected to each other. FIGS. 5A and 5B are equivalent circuit diagrams of the high pass filter 13. The high pass filter 13 differs from the high pass filter 11 illustrated in FIG. 1 in the first preferred embodiment in that the high pass filter 13 includes the second capacitor C2.

FIG. 5A is an equivalent circuit diagram in which a mutual inductance caused by the magnetic coupling between the first inductor L1 and the second inductor L2 is expressed as a circuit element. In the equivalent circuit illustrated in FIG. 5A, differences regarding a transmission coefficient of the high pass filter 13 due to differences between the Q factors of the individual inductors will be as follows.

Figure 6A:
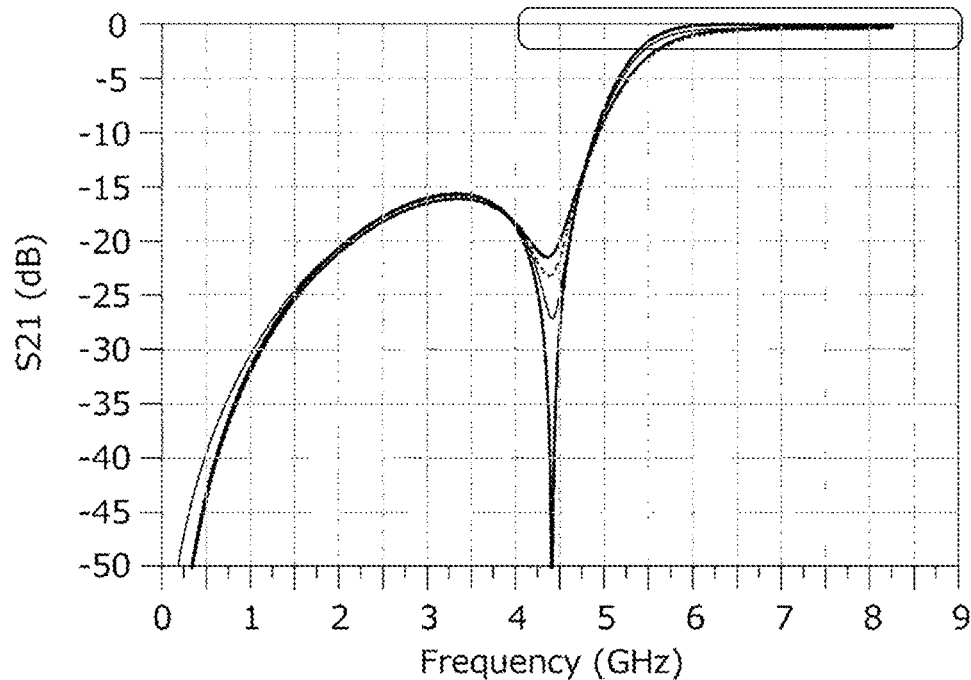
FIGS. 6A and 6B are diagrams illustrating frequency characteristics of a transmission coefficient of the high pass filter 13.
Figure 6B:
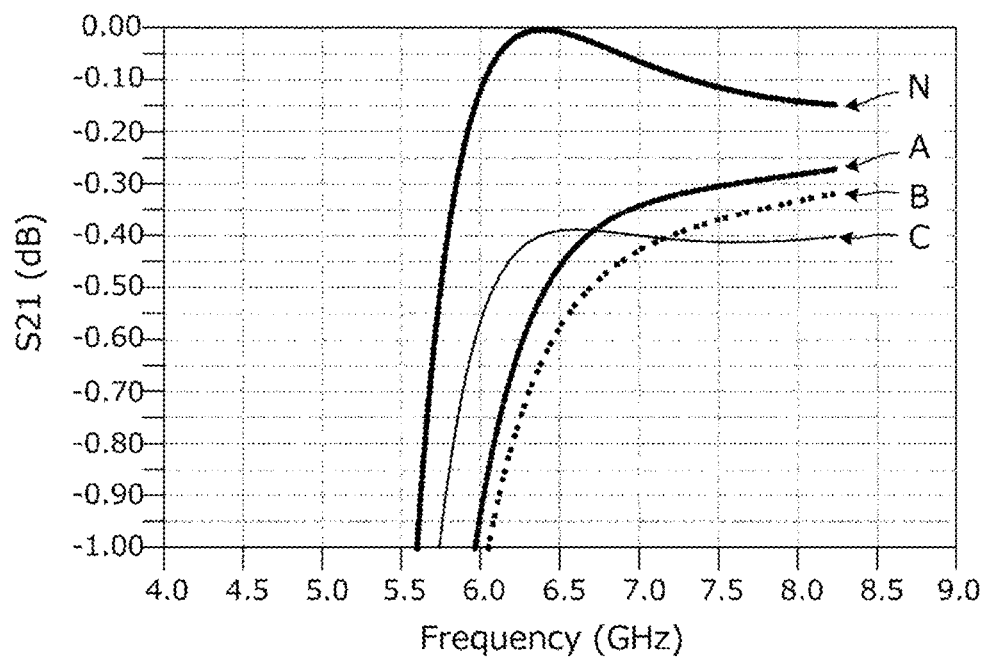

FIGS. 6A and 6B are diagrams illustrating frequency characteristics of the transmission coefficient of the high pass filter 13 according to the present preferred embodiment. The horizontal axes of FIGS. 6A and 6B represent frequency, and the vertical axes of FIGS. 6A and 6B represent values of a transmission coefficient S21. FIG. 6B is an enlarged view of a portion enclosed in the oblong figure in FIG. 6A.

As illustrated in FIG. 6A, the high pass filter 13 has the 6.24 GHz band and the 8.2 GHz band, which are used in UWB, as its pass bands and serves as a high pass filter having an insertion loss of about −3 dB at a cutoff frequency of about 5.6 GHz. In FIG. 6B, characteristics A are characteristics in a case where the Q factor of the inductor LA illustrated in FIG. 5A is low. Characteristics B are characteristics in a case where the Q factor of the inductor LB illustrated in FIG. 5A is low. Characteristics C are characteristics in a case where the Q factor of the inductor LC illustrated in FIG. 5A is low. Moreover, characteristics N are characteristics in a case where the inductors LA, LB, and LC illustrated in FIG. 5A are lossless.

As is clear from comparison between the characteristics A and B, the Q factor of the inductor LB affects insertion loss more greatly than the Q factor of the inductor LA. Moreover, the Q factor of the inductor LB affects the steepness from the attenuation band to the pass band more greatly than the Q factor of the inductor LA. Thus, as illustrated in FIG. 5A, insertion loss can be reduced over a wide band of the pass band by forming the inductor LB with the mutual inductance (M), which is lossless.

FIG. 5B is a circuit diagram obtained by converting, into a π circuit, the T circuit illustrated in FIG. 5A and including the inductors LA, LB, and LC. That is, the T circuit including the inductors LA, LB, and LC is expressed as a π circuit including the inductors L12, L1M, and L2M. With this configuration, a 4-stage high pass filter is configured.

Values of individual elements included in the high pass filter 13 illustrated in FIG. 4 and the coupling coefficient k between the first inductor L1 and the second inductor L2 are as follows.

L1: 1.2 nH
L2: 0.9 nH
C1: 0.75 pF
C2: 0.56 pF
k: 0.32

In this case, values of the individual elements included in the equivalent circuit illustrated in FIG. 5B are as follows.

L12: 2.8 nH
L1M: 1.6 nH
L2M: 1.1 nH
C1: 0.75 pF
C2: 0.56 pF

In this case, the total inductance of the inductors L12, L1M, and L2M is about 5.6 nH, whereas the total inductance of the first inductor L1 and the second inductor L2 is about 2.1 nH, for example. Thus, the total inductance can be reduced by as much as about 63%, for example. In the equivalent circuit illustrated in FIG. 5B, the total inductance of paths which are shunt-electrically connected to ground is about 3.9 nH, for example, and thus even only by making a comparison with this shunt connection portion, the inductance can be reduced by about half. This enables overall downsizing and increases the amount of attenuation in the attenuation band. "Ground" in this specification is a reference potential portion in a circuit and refers to electrical ground.

Figure 7:
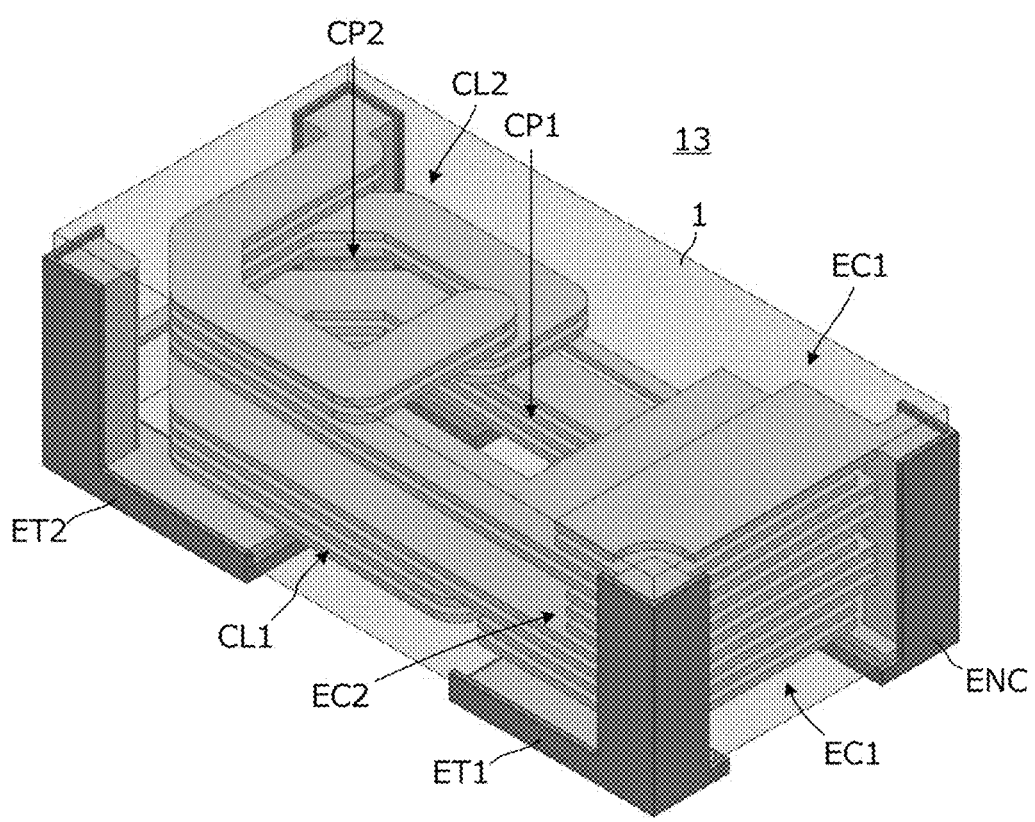
FIG. 7 is a perspective view of the high pass filter 13.

FIG. 7 is a perspective view of the high pass filter 13. The high pass filter 13 has a rectangular or substantially rectangular parallelepiped-shaped multilayer body 1 in which a plurality of rectangular or substantially rectangular insulator layers are stacked. On the outer surface of the multilayer body 1, for example, a first terminal electrode ET1, a second terminal electrode ET2, a ground terminal electrode (a terminal hidden behind an object in FIG. 7), and a floating terminal electrode ENC are formed by plating. The floating terminal electrode ENC is used for interlayer connection between internal electrodes.

The first inductor L1 includes a first coiled conductor CL1 in the multilayer body 1 including a plurality of insulator layers. The second inductor L2 includes a second coiled conductor CL2 in the multilayer body 1 including a plurality of insulator layers. The first coiled conductor CL1 of the first inductor L1 includes a first coil cavity CP1. The second coiled conductor CL2 of the second inductor L2 includes a second coil cavity CP2.

The winding axis of the first coiled conductor CL1 is parallel or substantially parallel to that of the second coiled conductor CL2. The coil cavity CP1 of the first coiled conductor CL1 and the coil cavity CP2 of the second coiled conductor CL2 have an overlapping region when viewed in the winding axis direction. With this structure, the first inductor L1 and the second inductor L2 are magnetically coupled to each other.

The first capacitor C1 includes first capacitor electrodes EC1 and insulator layers. The first capacitor electrodes EC1 face each other in the stacking direction of the plurality of insulator layers. The insulator layers are sandwiched between these first capacitor electrodes. The second capacitor C2 includes second capacitor electrodes EC2 and insulator layers. The second capacitor electrodes EC2 face each other in the stacking direction of the plurality of insulator layers. The insulator layers are sandwiched between these second capacitor electrodes.

Figure 8:
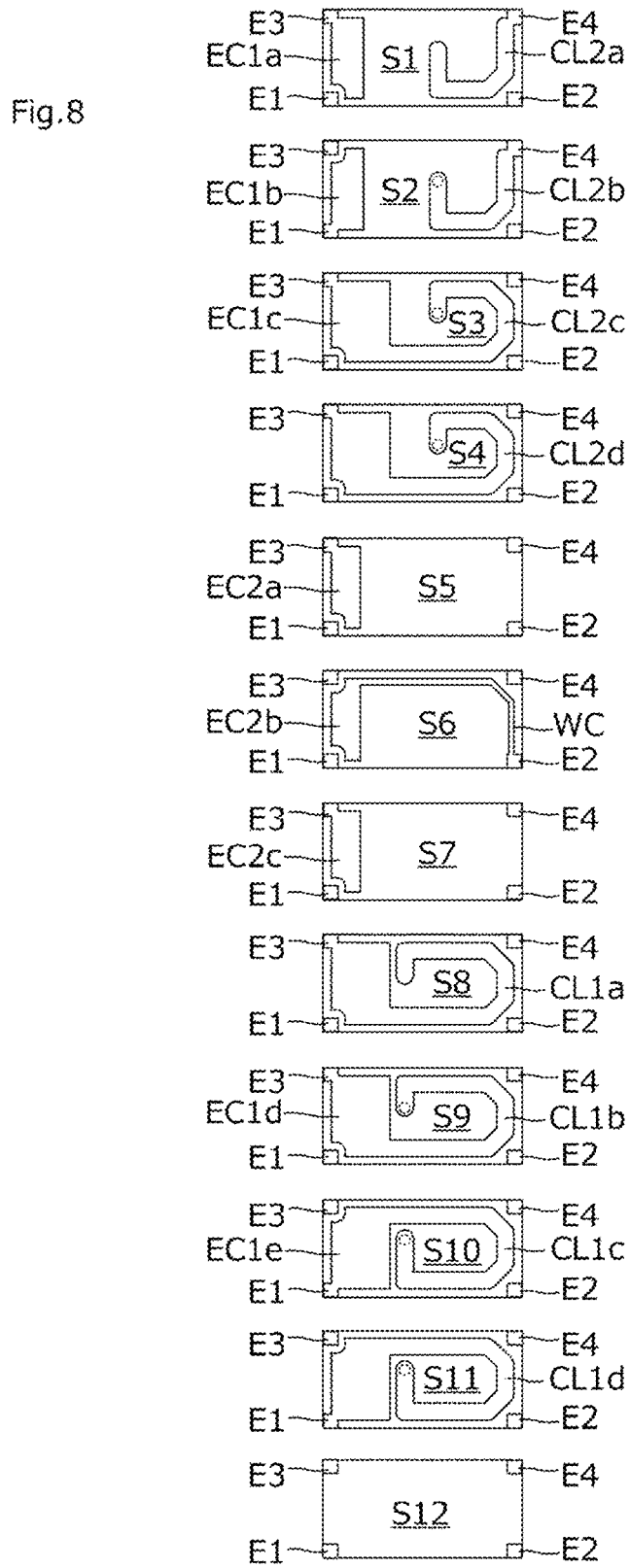
FIG. 8 includes exploded bottom views of individual insulator layers of the high pass filter 13 and conductive patterns formed on the insulator layers.

FIG. 8 includes exploded bottom views of individual insulator layers of the high pass filter 13 and conductive patterns located on the insulator layers.

The multilayer body 1 is defined by laminating insulator layers S1 to S12. FIG. 8 illustrates views of the individual insulator layers as viewed from the mounting terminal side. The insulator layer S1 is the uppermost insulator layer, and the insulator layer S12 is the lowermost insulator layer. The insulator layers S2 to S11 are insulator layers between the uppermost insulator layer S1 and the lowermost insulator layer S12.

Side terminal electrodes E1, E2, E3, and E4 are formed on the insulator layers S1 to S12. The side terminal electrodes E1, E2, E3, and E4 formed on the individual base layers are electrically connected to the terminal electrodes denoted by the same symbols. The side terminal electrodes E1, the side terminal electrodes E2, and the side terminal electrodes E3 are electrically connected to the first terminal electrode ET1, the second terminal electrode ET2, and the floating terminal electrode ENC illustrated in FIG. 7, respectively. The side terminal electrodes E4 are electrically connected to the ground terminal electrode.

Second coiled conductors CL2a, CL2b, CL2c, and CL2d formed on the insulator layers S1 to S4 define the second coiled conductor CL2 illustrated in FIG. 7. Similarly, first coiled conductors CL1a, CL1b, CL1c, and CL1d formed on the insulator layers S8 to S11 define the first coiled conductor CL1.

First capacitor electrodes EC1a, EC1b, and EC1c formed on the insulator layers S1 to S3 and first capacitor electrodes EC1d and EC1e formed on the insulator layers S9 and S10 define the first capacitor C1. Second capacitor electrodes EC2a, EC2b, and EC2c formed on the insulator layers S5, S6, and S7 define the second capacitor C2.

An end of the second coiled conductor CL2a and an end of the second coiled conductor CL2b are each electrically connected to the side terminal electrode E4. An end of the second coiled conductor CL2c is electrically connected to the side terminal electrode E3 with the first capacitor electrode EC1c interposed therebetween, and an end of the second coiled conductor CL2d is electrically connected to the side terminal electrode E3.

An end of the first coiled conductor CL1a is electrically connected to the side terminal electrode E3, and an end of the first coiled conductor CL1b is electrically connected to the side terminal electrode E3 with the capacitor electrode EC1d interposed therebetween. An end of the first coiled conductor CL1c is electrically connected to the side terminal electrode E1 with the capacitor electrode EC1e interposed therebetween, and an end of the first coiled conductor CL1d is electrically connected to the side terminal electrode E1.

In this manner, the first coiled conductors CL1b and CL1c and the first capacitor electrodes EC1d and EC1e are defined by continuous conductive patterns. With this structure, a parasitic capacitance generated between the first coiled conductor CL1b and the first coiled conductor CL1c can be used as part of the first capacitor C1. Thus, the first capacitor electrodes EC1d and EC1e can be reduced in size, and the overall size can be reduced accordingly. Alternatively, the extra space resulting from downsizing enables the line width of the coiled conductors of the first inductor to be increased, thus increasing the Q factor of the first inductor and improving the filter characteristics. (Insertion loss in the pass band can be reduced, and attenuation in the stop band can be made deeper.)

In this manner, the first coiled conductors CL1b and CL1c and the first capacitor electrodes EC1d and EC1e are defined by continuous conductive patterns. With this structure, a parasitic capacitance generated between the first coiled conductor CL1b and the first coiled conductor CL1c can be used as part of the first capacitor C1. Thus, the first capacitor electrodes EC1d and EC1e can be reduced in size, and the overall size can be reduced accordingly. Alternatively, the extra space resulting from downsizing enables the line width of the coiled conductors of the first inductor to be increased, thus further increasing the Q factor of the filter and further reducing insertion loss.

A wiring conductor WC is provided between the second capacitor electrode EC2b and the side terminal electrode E2. The wiring conductor WC is a conductor connected in series between the second capacitor C2 and the second terminal 12. In this manner, the wiring conductor WC is spaced apart from the coiled conductors CL1 and CL2 in the stacking direction. This structure helps to suppress parasitic capacitance generated between the wiring conductor WC and the coiled conductors CL1 and CL2 (especially the second coiled conductor CL2). Moreover, this helps to prevent the wiring conductor WC from blocking magnetic flux generated from the coiled conductors CL1 and CL2, so that a reduction in the Q factor of the first inductor L1 and/or a reduction in that of the second inductor L2 is suppressed or prevented.

Moreover, the wiring conductor WC has a conductor width smaller than at least one of the conductor width of the first coiled conductors CL1a, CL1b, CL1c, and CL1d or the conductor width of the second coiled conductors CL2a, CL2b, CL2c, and CL2d. With this structure, a parasitic capacitance generated between the wiring conductor WC and another conductor adjacent to the wiring conductor WC in the stacking direction is further reduced or prevented. This structure helps to prevent the wiring conductor WC from blocking magnetic flux generated by the coiled conductors CL1 and CL2, so that a reduction in the Q factor of the first inductor L1 and/or a reduction in that of the second inductor L2 is suppressed or prevented.

As illustrated in FIG. 7 or FIG. 8, an (E1 side) end portion of the first coiled conductor CL1 and an (E4 side) end portion of the second coiled conductor CL2 are spaced apart from each other with the first coiled conductor CL1, the second coiled conductor CL2, and the connection portions of the first and second coiled conductors CL1 and CL2 interposed therebetween. Thus, the ends of the coils are not close to each other, and the coils themselves serve as shields, so that the parasitic capacitance between the coils and the effects of the parasitic capacitance are reduced or prevented. Thus, degradation of the bandpass characteristics is reduced or prevented in the high frequency band.

Fourth Preferred Embodiment

In a fourth preferred embodiment, an example of a filter module will be illustrated.

Figure 9:
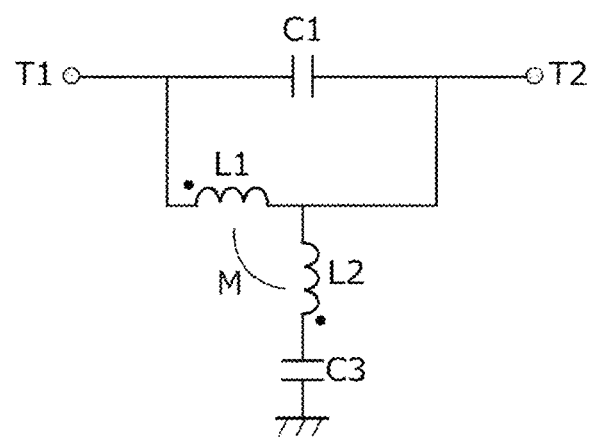
FIG. 9 is a circuit diagram of a band rejection filter 14A according to a fourth preferred embodiment of the present invention.

FIG. 9 is a circuit diagram of a band rejection filter 14A according to the fourth preferred embodiment. The band rejection filter 14A has a configuration in which the high pass filter 11 illustrated in FIG. 2A is provided with a capacitor C3. The capacitor C3 is connected in series with the second inductor L2, which is provided along a path which is shunt-electrically connected to ground. As a result, a configuration is obtained in which the series resonant circuit which is shunt-electrically connected to ground. This series resonant circuit causes a current to flow to ground at a specific frequency, and thus this whole configuration serves as a band rejection filter.

Figure 10:
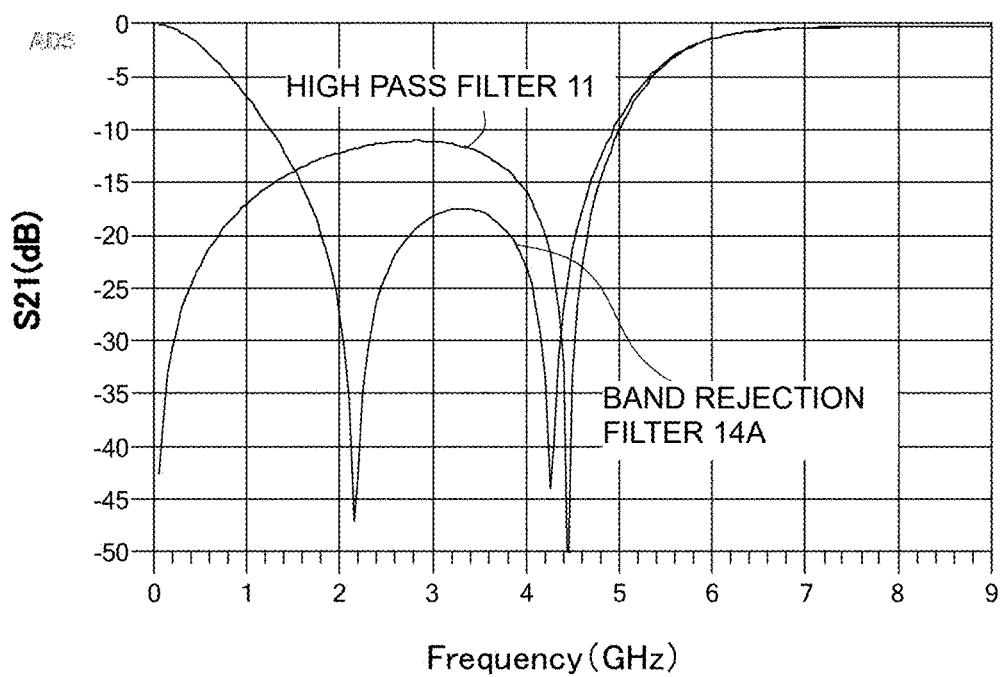
FIG. 10 is a diagram illustrating frequency characteristics of the transmission coefficient of the high pass filter 11 illustrated in FIGS. 2A to 2D and frequency characteristics of the transmission coefficient of the band rejection filter 14A illustrated in FIG. 9.

FIG. 10 is a diagram illustrating frequency characteristics of the transmission coefficient of the high pass filter 11 illustrated in FIG. 2 and frequency characteristics of the transmission coefficient of the band rejection filter 14A illustrated in FIG. 9. As illustrated in FIG. 10, two attenuation poles appear in the band rejection filter 14A illustrated in FIG. 9, and thus it is clear that the band rejection filter 14A functions as a band rejection filter.

Figure 11:
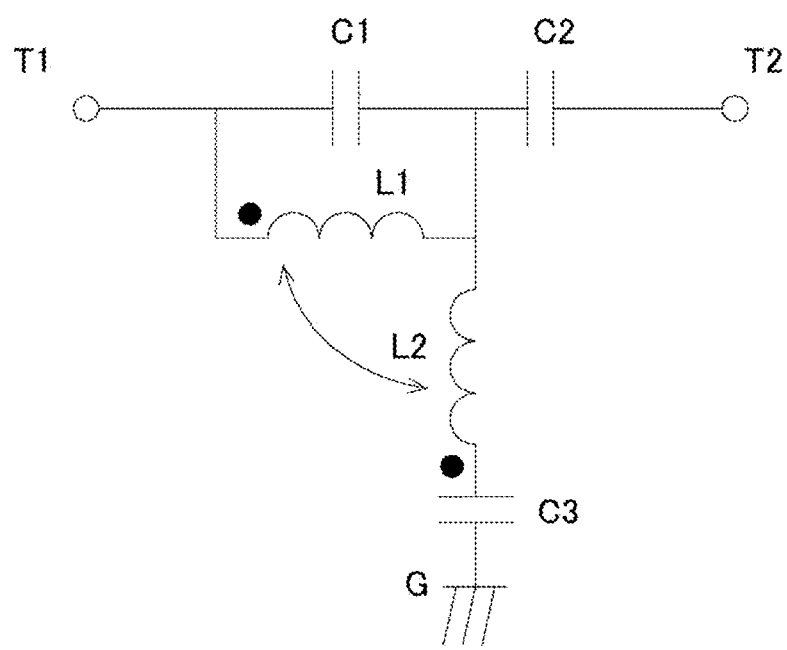
FIG. 11 is an equivalent circuit diagram of a high pass filter 14B, which is obtained by adding a capacitor C3 to the high pass filter 13.
Figure 12:
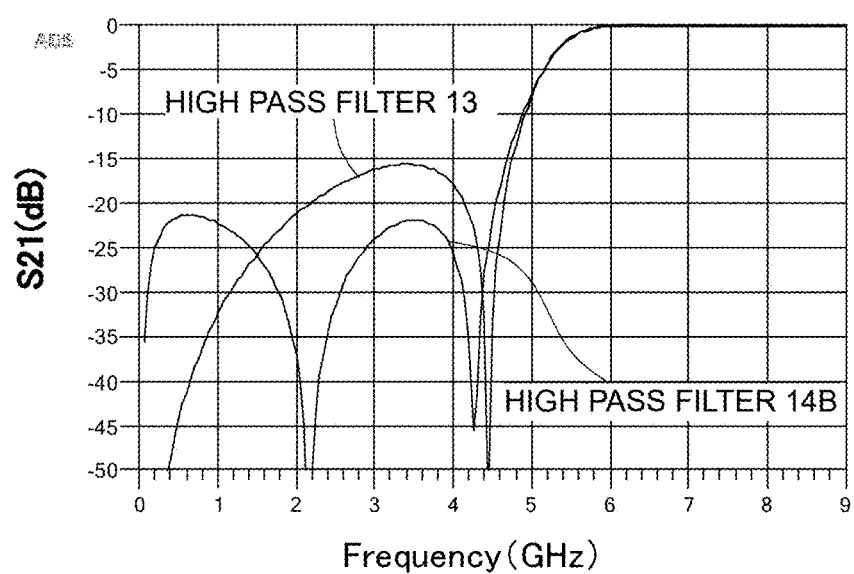
FIG. 12 is a diagram illustrating frequency characteristics of the transmission coefficient of the high pass filter 13 illustrated in FIG. 4 and frequency characteristics of the transmission coefficient of the high pass filter, which is obtained by adding the capacitor C3 to the high pass filter 13.

FIG. 11 is an equivalent circuit diagram of a high pass filter 14B, which is obtained by adding the capacitor C3 to the high pass filter 13. FIG. 12 is a diagram illustrating frequency characteristics of the transmission coefficient of the high pass filter 13 illustrated in FIG. 4 and frequency characteristics of the transmission coefficient of the high pass filter 14B, which is obtained by adding the capacitor C3 to the high pass filter 13. As a result, the high pass filter 14B, which is obtained by adding the capacitor C3 to the high pass filter 13, serves as a high pass filter having two attenuation poles.

Figure 13:
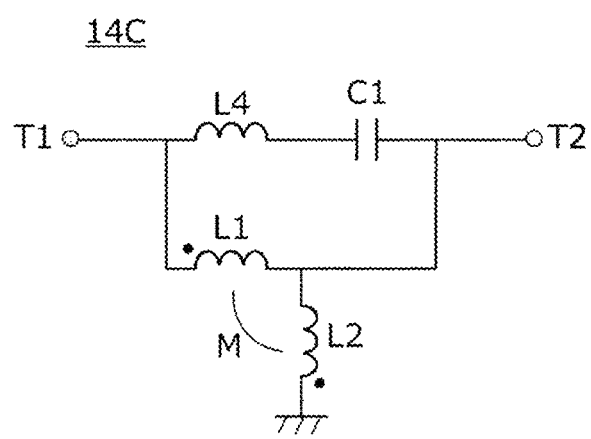
FIG. 13 is a circuit diagram of a band pass filter 14C according to the fourth preferred embodiment of the present invention.

FIG. 13 is a circuit diagram of a band pass filter 14C according to the fourth preferred embodiment. The band pass filter 14C has a configuration in which the high pass filter illustrated in FIG. 2A is provided with an inductor L4. The inductor L4 is connected in series with the capacitor C1 provided along a path connected s with a signal line. As a result, a configuration is obtained in which the series resonant circuit is connected in series with the signal line. This series resonant circuit allows passage at specific frequencies, and thus this whole configuration serves as a band pass filter.

Note that, in FIGS. 9, 11, and 13, filter modules are configured by adding a capacitor or an inductor to the circuit illustrated in FIG. 2A as a base. However, these are examples. Other than these filter modules, for example, a band pass filter may be configured by providing the inductor L4 along the path connected in series with the signal line in FIG. 4.

Fifth Preferred Embodiment

In a fifth preferred embodiment, another example of a filter module will be described.

Figure 14A:
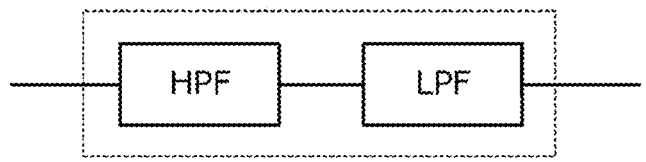
FIGS. 14A to 14D are block diagrams illustrating the configurations of filter modules.

FIG. 14A is a block diagram illustrating the configuration of a band pass filter. This band pass filter has a configuration in which a high pass filter HPF and a low pass filter LPF are cascade connected. This high pass filter HPF includes any one of the high pass filters described in the first and second preferred embodiments.

Figure 14B:
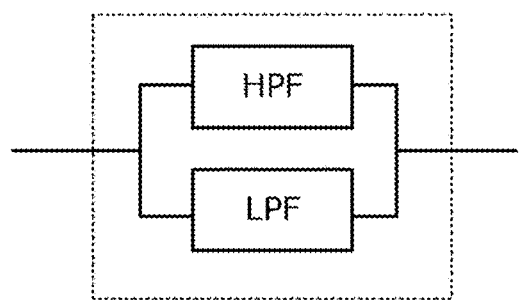

FIG. 14B a block diagram illustrating the configuration of a band rejection filter. This band rejection filter has a configuration in which a high pass filter HPF and a low pass filter LPF are connected in parallel. This high pass filter HPF includes any one of the high pass filters described in the first and second preferred embodiments.

Figure 14C:
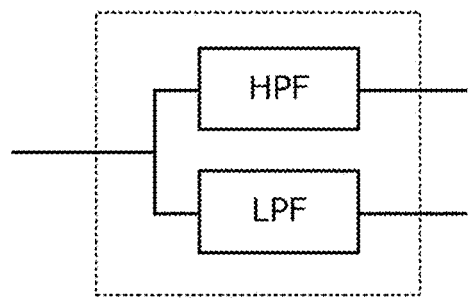

FIG. 14C is a block diagram illustrating the configuration of a diplexer. This diplexer includes a high pass filter HPF and a low pass filter LPF. An end of the high pass filter HPF and an end of the low pass filter LPF are connected so as to provide a common connection. This high pass filter HPF includes any one of the high pass filters described in the first and second preferred embodiments.

Figure 14D:
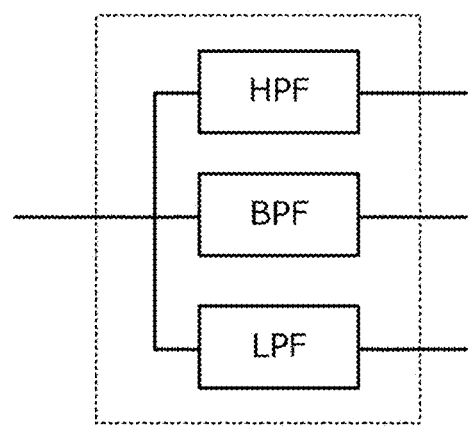

FIG. 14D is a block diagram illustrating the configuration of a triplexer. This triplexer includes a high pass filter HPF, a band pass filter BPF, and a low pass filter LPF. An end of the high pass filter HPF, an end of the band pass filter BPF, and an end of the low pass filter LPF are connected so as to provide a common connection. This high pass filter HPF includes any one of the high pass filters described in the first and second preferred embodiments.

Note that a multiplexer can be configured in the same manner as in the examples illustrated in FIGS. 14C and 14D.

Figure 15:
FIG. 15 is a block diagram illustrating the configuration of a high pass filter.

FIG. 15 is a block diagram illustrating the configuration of a high pass filter. In this high pass filter, two high pass filters HPF are cascade connected. The two high pass filters HPF are each including any one of the high pass filters illustrated in the first and second preferred embodiments. Moreover, one of the two high pass filters HPF may be a high pass filter other than the high pass filters described in the first and second preferred embodiments.

Figure 16:
FIG. 16 is a block diagram illustrating the configuration of a high pass filter.

FIG. 16 block is a diagram illustrating the configuration of a high pass filter. This high pass filter includes a high pass filter HPF and a capacitor C. The capacitor C is connected in series with an end of one of the terminal pairs of the high pass filter HPF. That is, in this high pass filter, the high pass filter HPF and the capacitor C, which is connected in series with the high pass filter HPF, are cascade connected. The high pass filter HPF includes any one of the high pass filters described in the first and second preferred embodiments.

Figure 17:
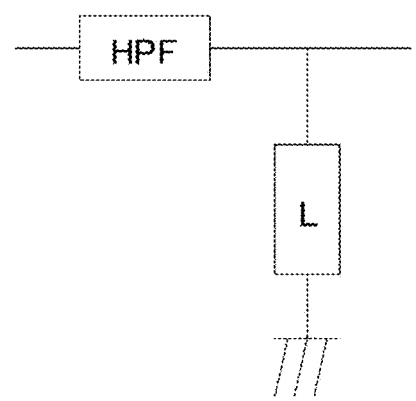
FIG. 17 is a block diagram illustrating the configuration of a high pass filter.

FIG. 17 is a block diagram illustrating the configuration of a high pass filter. This high pass filter includes a high pass filter HPF and an inductor L. An end of the inductor L is connected to an end of one of the terminal pairs of the high pass filter HPF. The other end of the inductor L is connected to ground, that is, to the other end of the one of the terminal pairs of the high pass filter HPF. That is, in this high pass filter, the high pass filter HPF and the inductor L, which is connected in parallel with the high pass filter HPF, are cascade connected. The high pass filter HPF includes any one of the high pass filters described in the first and second preferred embodiments.

Figure 18:
FIG. 18 is a block diagram illustrating the configuration of a high pass filter.

FIG. 18 is a block diagram illustrating the configuration of a high pass filter. This high pass filter includes a high pass filter HPF and an anti-resonator (an LC parallel resonant circuit). The anti-resonator (the LC parallel resonant circuit) includes a parallel connection circuit including an inductor L and a capacitor C. The anti-resonator (the LC parallel resonant circuit) is connected in series with an end of one of the terminal pairs of the high pass filter HPF. That is, in this high pass filter, the high pass filter HPF and the anti-resonator (the LC parallel resonant circuit), which is connected in series with the high pass filter HPF, are cascade connected. The high pass filter HPF includes any one of the high pass filters described in the first and second preferred embodiments.

Figure 19:
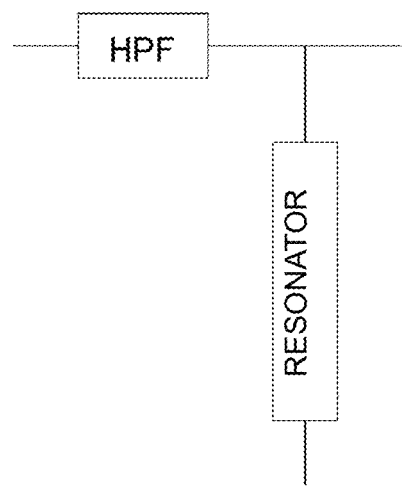
FIG. 19 is a block diagram illustrating the configuration of a high pass filter.

FIG. 19 is a block diagram illustrating the configuration of a high pass filter. This high pass filter includes a high pass filter HPF and a resonator (an LC series resonant circuit). The resonator (the LC series resonant circuit) includes a series connection circuit including an inductor L and a capacitor C. An end of the resonator (the LC series resonant circuit) is connected to an end of one of the terminal pairs of the high pass filter HPF. The other end of the resonator (the LC series resonant circuit) is connected to ground, that is, to the other end of the one of the terminal pairs of the high pass filter HPF. That is, in this high pass filter, the high pass filter HPF and the resonator (the LC series resonant circuit), which is connected in parallel with the high pass filter HPF, are cascade connected. The high pass filter HPF includes any one of the high pass filters described in the first and second preferred embodiments.

Figure 20:
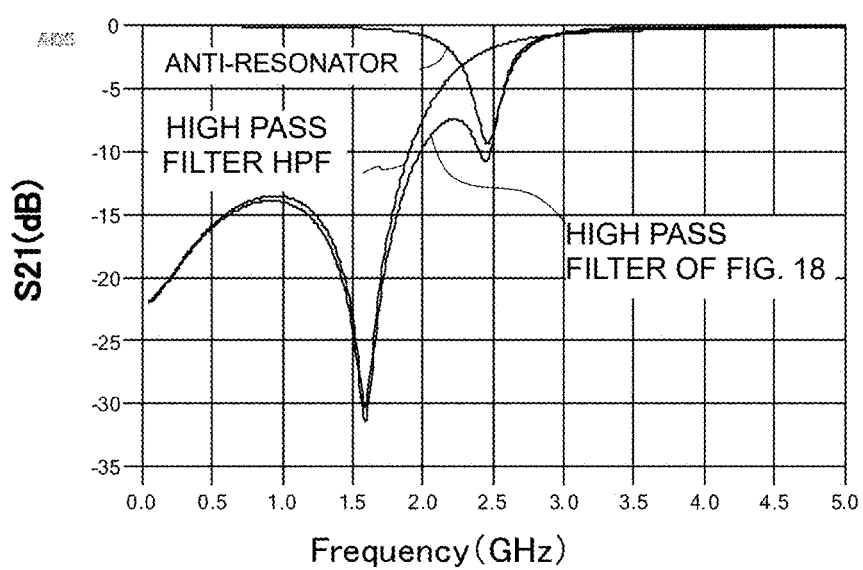
FIG. 20 is a diagram illustrating frequency characteristics of the transmission coefficient of the high pass filter illustrated in FIG. 18, frequency characteristics of the transmission coefficient of only a high pass filter HPF in the high pass filter illustrated in FIG. 18, and frequency characteristics of the transmission coefficient of an anti-resonator (an LC series resonant circuit) in the high pass filter illustrated in FIG. 18.

In this case, FIG. 20 is a diagram illustrating frequency characteristics of the transmission coefficient of the high pass filter illustrated in FIG. 18, frequency characteristics of the transmission coefficient of only the high pass filter HPF in the high pass filter illustrated in FIG. 18, and frequency characteristics of the transmission coefficient of only the anti-resonator (the LC parallel resonant circuit) connected in series in the high pass filter illustrated in FIG. 18.

As illustrated in FIG. 20, only one attenuation pole is located in the frequency characteristics of the transmission coefficient of only the high pass filter HPF in the high pass filter illustrated in FIG. 18, and in the frequency characteristics of the transmission coefficient of only the anti-resonator (the LC parallel resonant circuit) connected in series in the high pass filter illustrated in FIG. 18. In contrast, two attenuation poles are formed in the frequency characteristics of the transmission coefficient of the high pass filter illustrated in FIG. 18.

Figure 21:
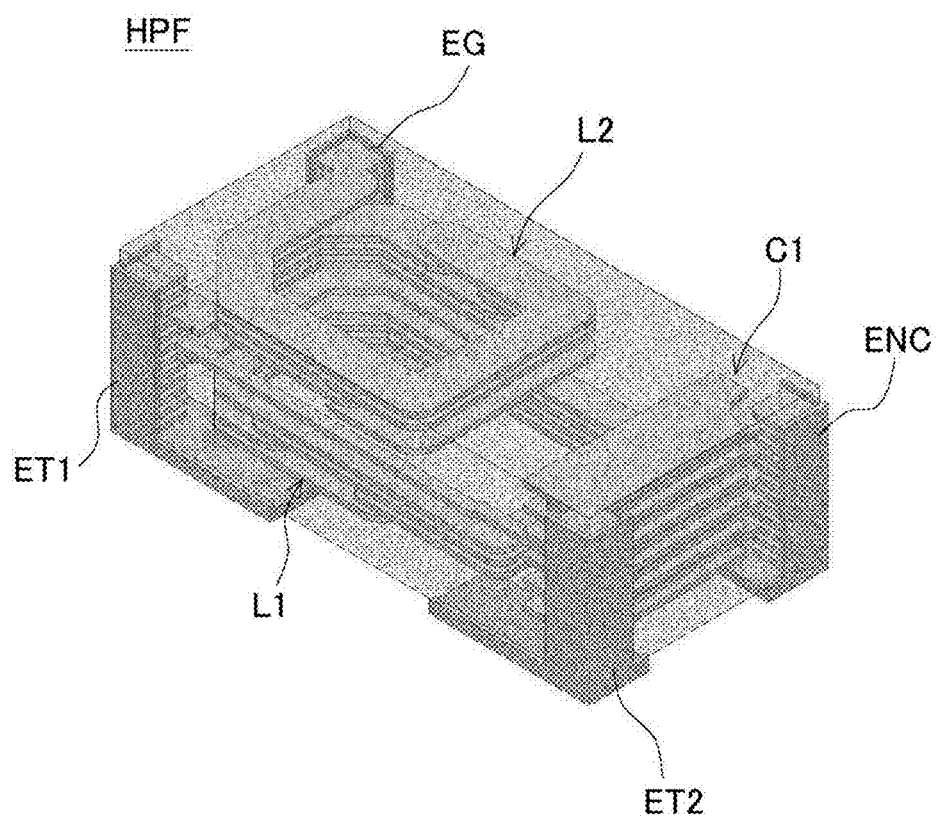
FIG. 21 is a perspective view of the high pass filter HPF in the high pass filter illustrated in FIG. 18.
Figure 22:
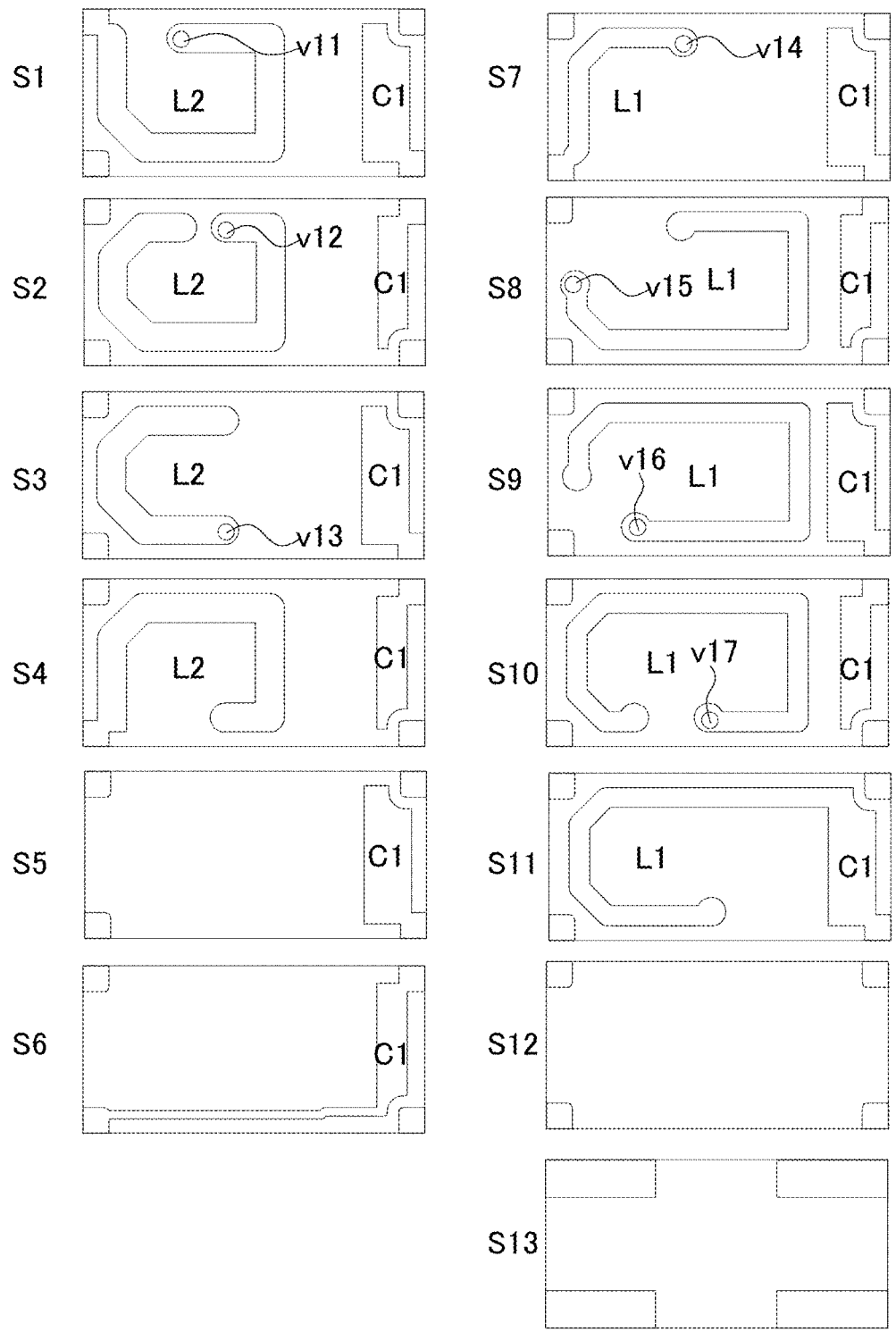
FIG. 22 includes exploded views of the high pass filter HPF illustrated in FIG. 21.
Figure 23:
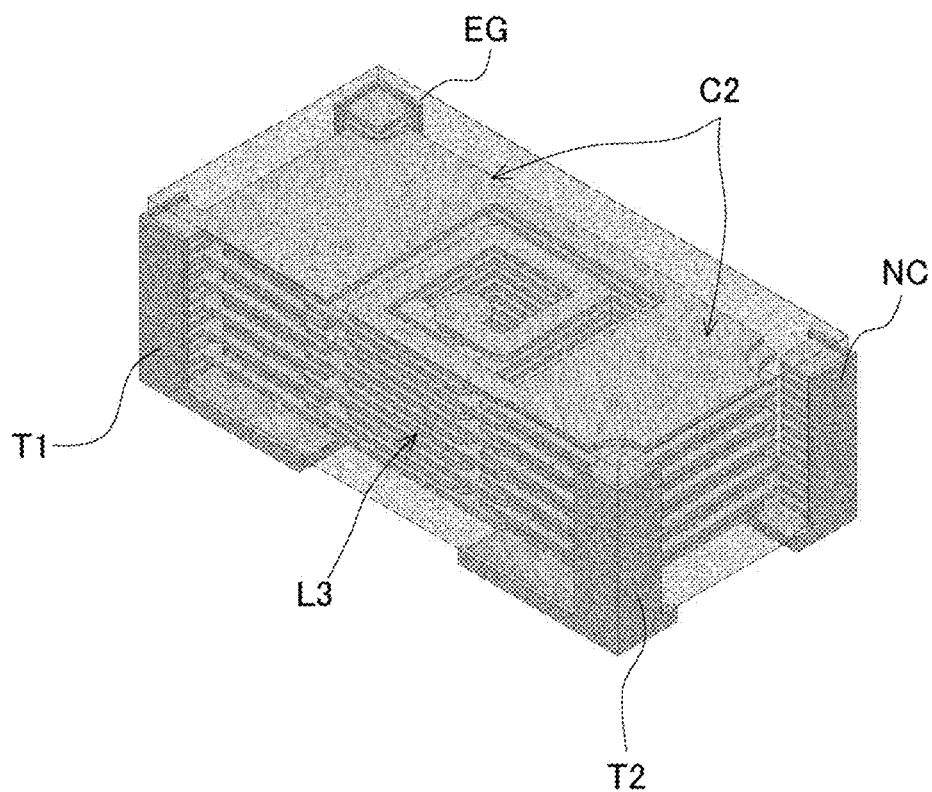
FIG. 23 is a perspective view of the anti-resonator (the LC parallel resonant circuit) illustrated in FIG. 18.
Figure 24:
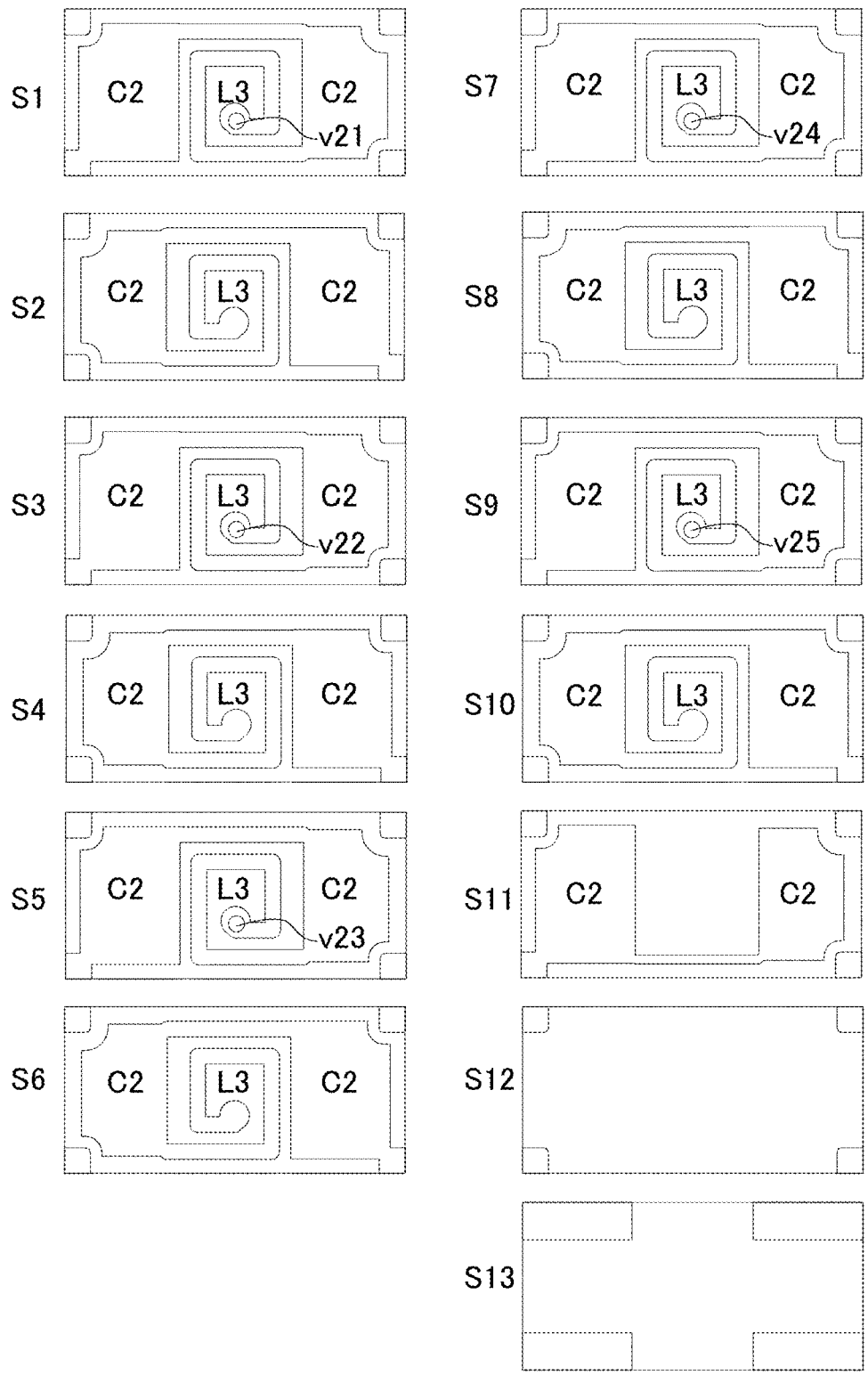
FIG. 24 includes exploded views of the anti-resonator (the LC parallel resonant circuit) illustrated in FIG. 23.

FIG. 21 is a perspective view of the high pass filter HPF in the high pass filter illustrated in FIG. 18. FIG. 22 includes exploded views of the high pass filter HPF illustrated in FIG. 21. FIG. 23 is a perspective view of the anti-resonator (the LC parallel resonant circuit) illustrated in FIG. 18. FIG. 24 includes exploded views of the anti-resonator (the LC parallel resonant circuit) illustrated in FIG. 23.

As illustrated in FIGS. 21 and 22, the first inductor L1 is located in the lower portion of the multilayer body of the high pass filter HPF. The inductor L1 is located in the left portions and the central portions of the insulator layers S7 to S11. The inductor L1 has a structure in which the conductor layers provided on the insulator layers S7 to S11 are connected by interlayer connection conductors v14 to v17. The first inductor L1 is connected to the first terminal electrode ET1 and the first capacitor C1.

The second inductor L2 is positioned above the first inductor L1. The inductor L2 is provided in the left portions of the insulator layers S1 to S4. The inductor L2 has a structure in which the conductor layers provided on the insulator layers S1 to S4 are connected by interlayer connection conductors v11 to v13. The second inductor L2 is connected to a ground terminal EG and the first terminal electrode ET1.

The first capacitor C1 is positioned to the right of the first inductor L1 and the second inductor L2. In the first capacitor C1, a plurality of rectangular conductor layers on the respective insulator layers S1 to S11 are superposed with each other in the up-down direction. The first capacitor C1 is connected to the second terminal electrode ET2 and the floating terminal electrode ENC. Note that the four corners of the insulator layers S1 to S12 are provided with interlayer connection conductors.

As illustrated in FIGS. 23 and 24, the capacitor C2 is divided into a left side and a right side. In the capacitor C2, a plurality of rectangular or substantially rectangular conductor layers on the respective left and right portions of the insulator layers S1 to S11 are superposed with each other in the up-down direction. The second capacitor C2 is connected to the terminal electrode T1 and the inductor L3.

The inductor L3 is provided within the capacitor C2. More specifically, the inductor L3 is formed or located in the central portions of the insulator layers S1 to S10. The inductor L3 has a structure in which the conductor layers provided on the insulator layers S1 to S10 are connected by interlayer connection conductors v21 to v25. The third inductor L3 is connected to the terminal electrode 12 and the second capacitor C2. Note that the four corners of the insulator layers S1 to S12 are provided with interlayer connection conductors.

A capacitor electrode that overlaps the cavity of a coil serving as the inductor L is not disposed in the high pass filter HPF or the anti-resonator (the LC parallel resonant circuit). This enables loss due to an eddy current caused by a capacitor electrode to be reduced or prevented in the inductor L, and the Q factor of the inductor L to be increased. In the high pass filter HPF, capacitor electrodes are arranged outside the coil and on the same layers as the coil electrodes when viewed from the winding axis direction of the coil. In the anti-resonator (the LC parallel resonant circuit), the outermost winding portion of the coil electrode of each layer is thicker than the other portion such that the outermost winding portion of the coil electrode of each layer also serves as a capacitor electrode. As a result, the coil electrode and the capacitor electrode are integrated with each other. Thus, the spacing between the coil electrode and the capacitor electrode becomes unnecessary, and the size of the coil shape can be increased, thus enabling the Q factor of the inductor L to be increased. With these configurations, it is thus easy to increase the Q factors of the inductors of the high pass filter HPF and the anti-resonator (the LC parallel resonant circuit). As a result, high frequency signal loss in the pass band becomes low, and high frequency signal loss outside the pass band becomes high. Furthermore, the attenuation poles become deeper.

Figure 25:
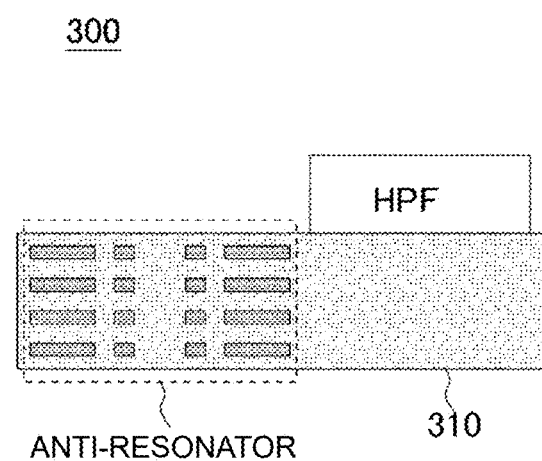
FIG. 25 is an example of a cross-sectional view of a high pass filter 300 illustrated in FIG. 18.

FIG. 25 is an example of a cross-sectional view of a high pass filter 300, which is illustrated in FIG. 18. The high pass filter 300 includes a substrate 310 and the high pass filter HPF. The high pass filter HPF is mounted on the substrate 310. The anti-resonator (the LC parallel resonant circuit) is defined by conductor layers and interlayer connection conductors provided in the substrate 310. Since the high pass filter HPF and the anti-resonator (the LC parallel resonant circuit) are not superposed with each other when viewed from the stacking direction of the substrate 310, a reduction in the Q factor of the inductor of the high pass filter HPF and a reduction in the Q factor of the inductor of the anti-resonator (the LC parallel resonant circuit) are suppressed or prevented.

Figure 26:
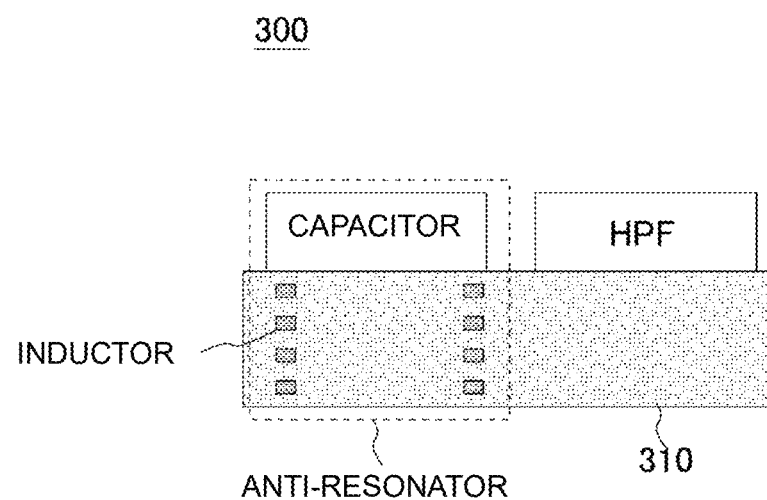
FIG. 26 is an example of a cross-sectional view of the high pass filter 300 illustrated in FIG. 18.

FIG. 26 is an example of a cross-sectional view of the high pass filter 300, which is illustrated in FIG. 18. The high pass filter 300 includes the substrate 310, the high pass filter HPF, and the capacitor. The high pass filter HPF and the capacitor are mounted on the substrate 310. The capacitor is, for example, a multilayer ceramic capacitor. The inductor is defined by the conductor layers and the interlayer connection conductors provided in the substrate 310. The capacitor and the inductor define the anti-resonator (the LC parallel resonant circuit). By using a mounting component as part of the anti-resonator (the LC parallel resonant circuit), a capacitor with a high capacitance can be used. The degree of freedom in the design of the high pass filter 300 is thus increased. Moreover, the Q factor of the inductor is increased.

Figure 27:
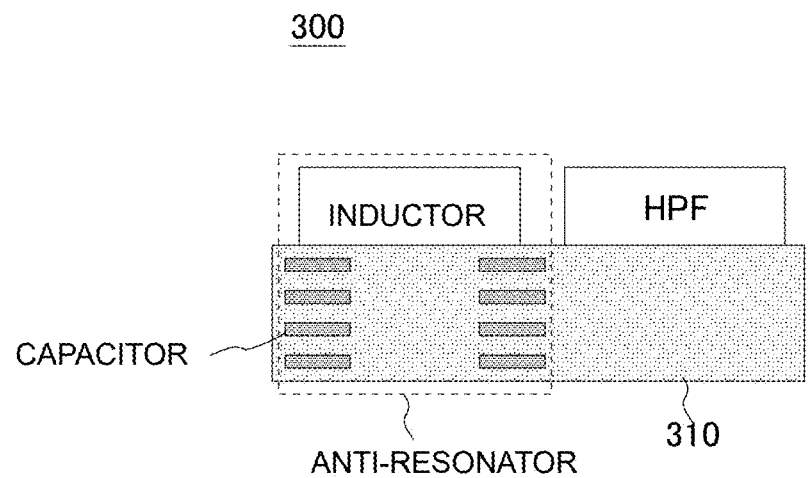
FIG. 27 is an example of a cross-sectional view of the high pass filter 300 illustrated in FIG. 18.

FIG. 27 is an example of a cross-sectional view of the high pass filter 300, which is illustrated in FIG. 18. The high pass filter 300 includes the substrate 310, the high pass filter HPF, and the inductor. The high pass filter HPF and the inductor are mounted on the substrate 310. The capacitor is defined by conductor layers provided in the substrate 310. The capacitor and the inductor form the anti-resonator (the LC parallel resonant circuit). By using a mounting component as part of the anti-resonator (the LC parallel resonant circuit), an inductor with a high inductance can be used. The degree of freedom in the design of the high pass filter 300 is thus increased. Moreover, the Q factor of the inductor is increased.

Figure 28:
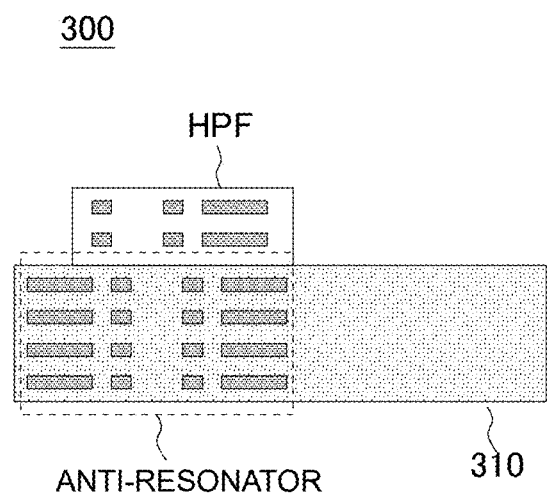
FIG. 28 is an example of a cross-sectional view of the high pass filter 300 illustrated in FIG. 18.

FIG. 28 is an example of a cross-sectional view of the high pass filter 300, which is illustrated in FIG. 18. The high pass filter 300 includes the substrate 310 and the high pass filter HPF. The high pass filter HPF is mounted on the substrate 310. The anti-resonator (the LC parallel resonant circuit) is defined by conductor layers and interlayer connection conductors provided in the substrate 310. The anti-resonator (the LC parallel resonant circuit) is superposed with the high pass filter HPF when viewed from the stacking direction of the substrate 310. The inductor of the anti-resonator (the LC parallel resonant circuit) is thus magnetically coupled to the inductor of the high pass filter HPF (the LC parallel resonant circuit). As a result, the degree of freedom in the design of the high pass filter 300 is increased. Moreover, it becomes possible to reduce the L value of the high pass filter 300, and an inductor can be designed to have a structure (a parallel wound structure, a thickly wound structure, or the like) having a high Q factor.

Figure 29:
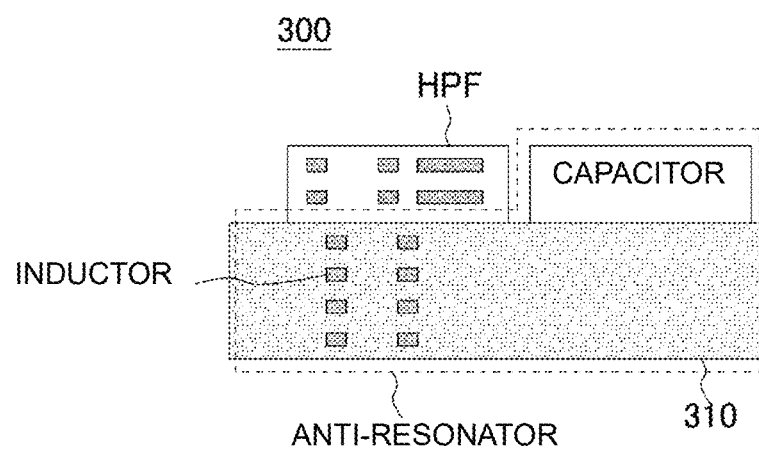
FIG. 29 is an example of a cross-sectional view of the high pass filter 300 illustrated in FIG. 18.

FIG. 29 is an example of a cross-sectional view of the high pass filter 300 illustrated in FIG. 18. The high pass filter 300 includes the substrate 310, the high pass filter HPF, and the capacitor. The high pass filter HPF and the capacitor are mounted on the substrate 310. The inductor is defined by conductor layers and interlayer connection conductors provided in the substrate 310. The anti-resonator (the LC parallel resonant circuit) is defined by the inductor and the capacitor. The inductor is superposed with the high pass filter HPF when viewed from the stacking direction of the substrate 310. The inductor of the anti-resonator (the LC parallel resonant circuit) is thus magnetically coupled to the inductor in the substrate 310. As a result, the degree of freedom in the design of the high pass filter 300 is increased. Moreover, it becomes possible to reduce the L value of the high pass filter 300, an inductor can be designed to have a structure (a parallel wound structure, a thickly wound structure, or the like) having a high Q factor.

Figure 30:
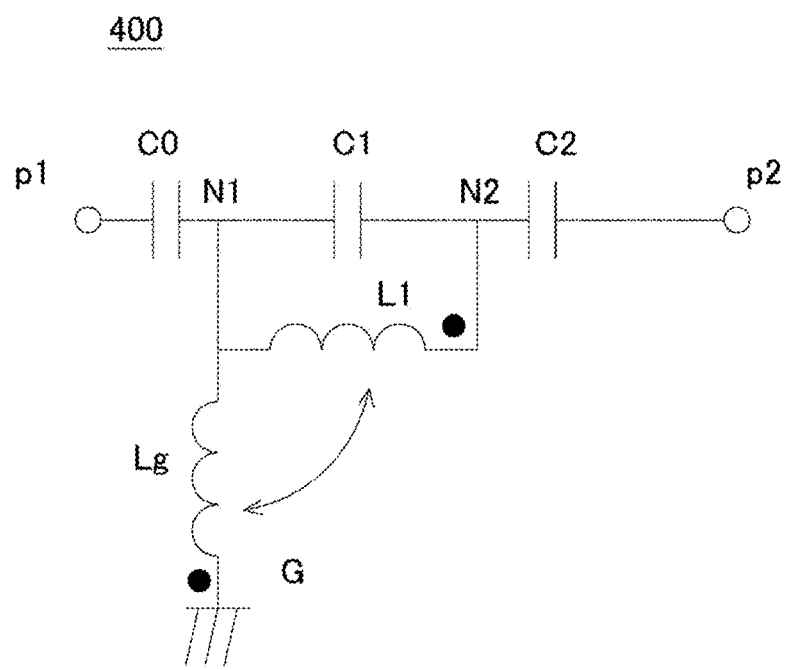
FIG. 30 is an equivalent circuit diagram of a high pass filter 400.
Figure 31:
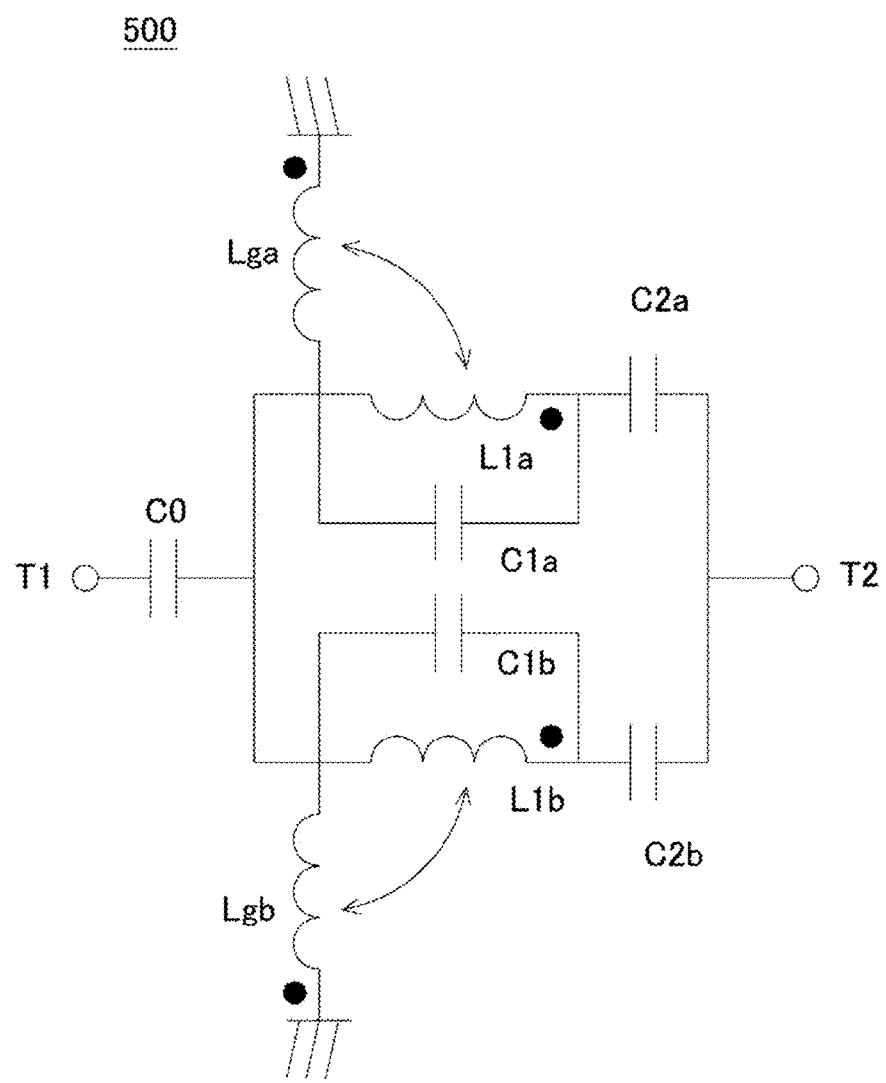
FIG. 31 is an equivalent circuit diagram of a high pass filter 500.

FIG. 30 is an equivalent circuit diagram of a high pass filter 400. FIG. 31 is an equivalent circuit diagram of a high pass filter 500. The high pass filter 400 illustrated in FIG. 30 is a 5-stage transformer HPF circuit. The high pass filter 400 has four external terminals. However, the high pass filter 400 has five nodes. Thus, the number of nodes is larger than the number of external terminals. Nodes p1, p2, and G are connected to external circuits. Thus, nodes N1 and N2 are defined by the remaining one external terminal and internal connection. Thus, either one of the nodes N1 and N2 has a structure in which interlayer connection is provided inside or is a structure without an interlayer connection.

In a case where interlayer connection is provided inside, interlayer connection conductors, a via reception conductor layer, and a space for the interlayer connection conductors and other conductor layers are necessary. Thus, degradation of the Q factor due to an increased equivalent series inductance (ESL), an increased ESR, and reduced space may significantly degrade the filter characteristics. In order to avoid such degradation of the characteristics, the high pass filter 400 that has a structure without interlayer connection was studied.

Furthermore, in a case where a high coupling coefficient (for example, k=about 0.4 to about 0.9) is necessary, when two inductors are simply arranged in the up-down direction, the gap between the layers of the two inductors needs to be reduced to increase the coupling coefficient. Since the two inductors are close to each other, the Q factors of the inductors become low. A structure will also be studied with which a reduction in Q factor is small while increasing the coupling coefficient.

The high pass filter 500 has the equivalent circuit illustrated in FIG. 31. This enables the number of interlayer connection conductors to be reduced. As a result, reductions in the Q factors of the inductors are suppressed or prevented.

Figure 32:
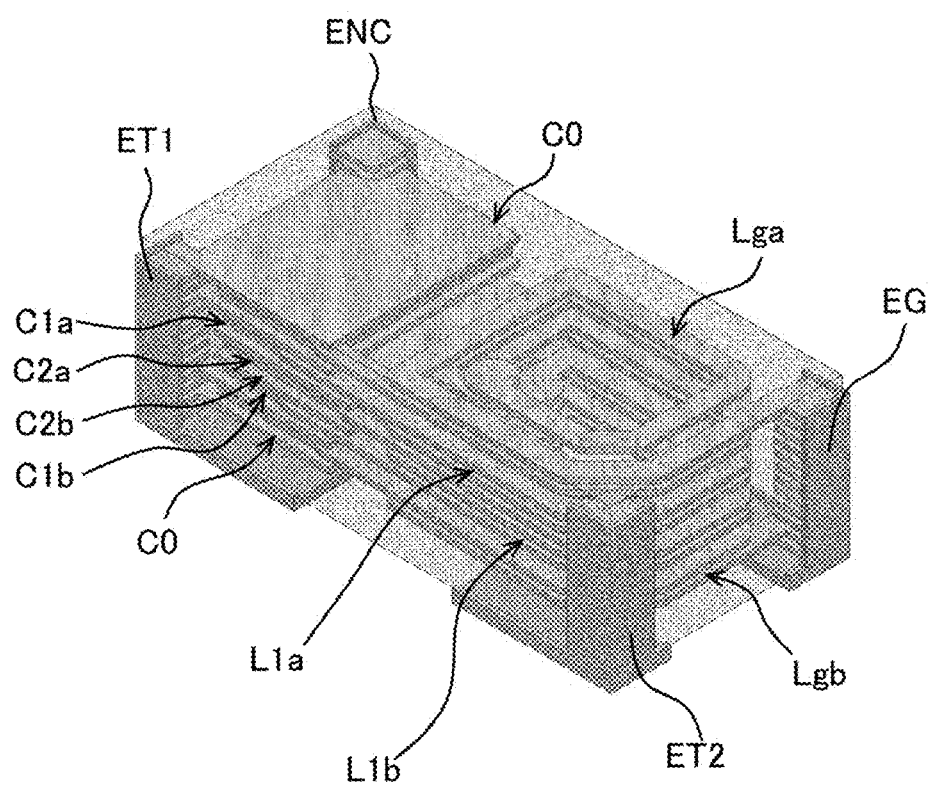
FIG. 32 is a perspective view of the high pass filter 500.
Figure 33:
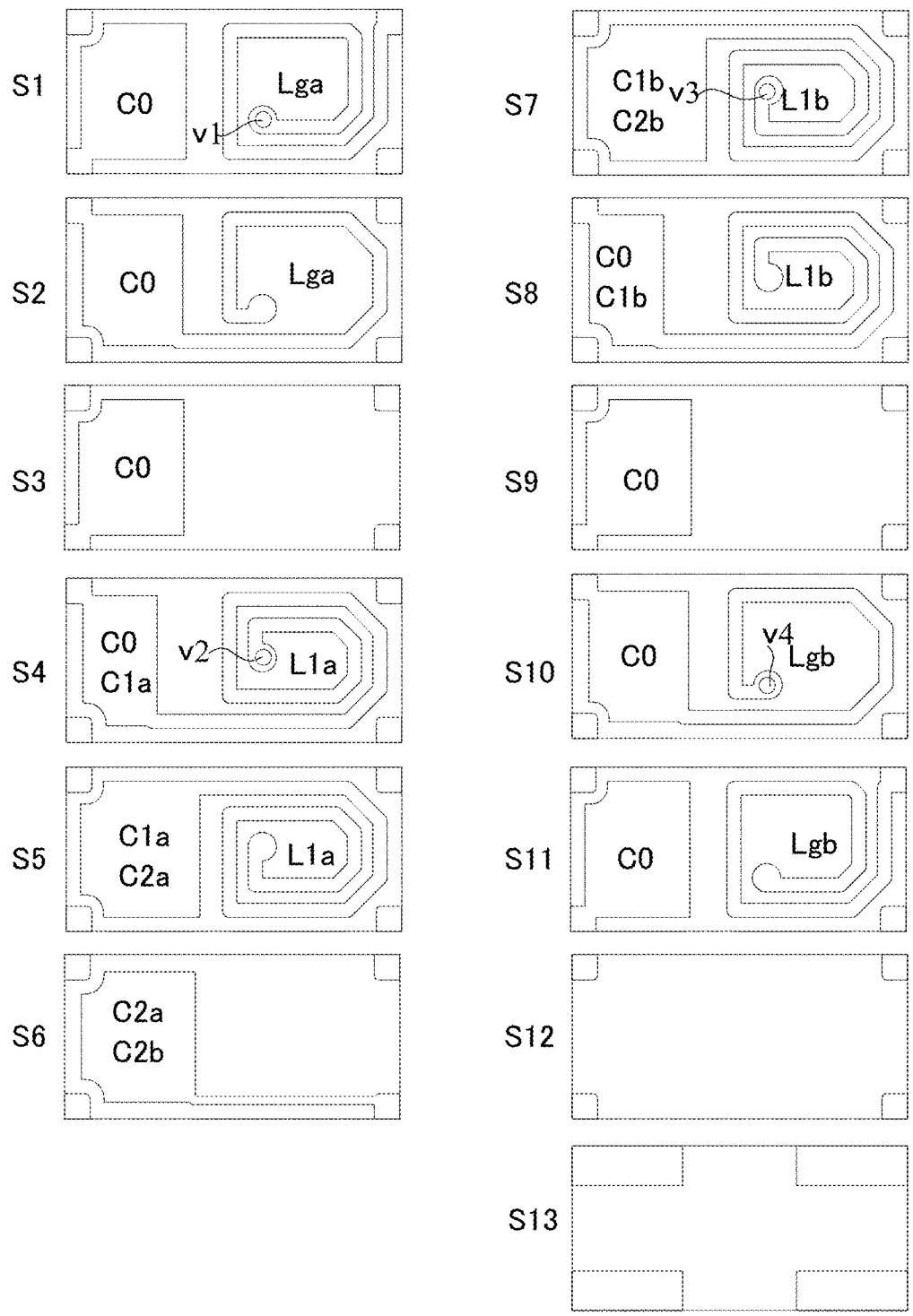
FIG. 33 includes exploded views of the high pass filter 500.

In the following, the structure of the high pass filter 500 illustrated in FIG. 31 will be described with reference to the drawings. FIG. 32 is a perspective view of the high pass filter 500. FIG. 33 includes exploded views of the high pass filter 500.

As illustrated in FIGS. 31 and 32, the high pass filter 500 has a structure in which internal electrode layers, insulator layers, and interlayer connection conductors between the internal electrode layers are vertically symmetrical, the insulator layers being positioned between the internal electrode layers. Inductors L1$a$ and Lga, capacitors C1$a$ and C2$a$, and half of a capacitor C0 are located in the upper half portion of the high pass filter 500. Inductors L1$b$ and Lgb, capacitors C1$b$ and C2$b$, and half of the capacitor C0 are located in the lower half portion of the high pass filter 500. As illustrated in FIG. 31, the high pass filter 500 is a circuit obtained by dividing the two-port network from the node N1 to the node p2 of the circuit of the high pass filter 400 illustrated in FIG. 30 into circuits that are connected in parallel with each other. The circuits obtained by division each have half the capacitance of the capacitor, two times the inductance of the inductor, and the same coupling coefficient. That is, C1$a$=C1$b$=C1/2, C2$a$=C2$b$=C2/2, L1$a$=L1$b$=L1×2, and Lga=Lgb=Lg×2.

The capacitor C0 is located on the left half portions of the insulator layers S1 to S4 and S8 to S11. The inductor Lga is, located on the right half portions of the insulator layers S1 and S2. The inductor Lga has a structure in which the conductor layer provided on the insulator layer S1 and the conductor layer provided on the insulator layer S2 are connected by an interlayer connection conductor v1.

The capacitor C1a is located on the left half portions of the insulator layers S4 and S5. The capacitor C1a is located between the conductor layer provided on the insulator layer S4 and the conductor layer provided on the insulator layer S5. The capacitor C2a is located on the left half portions of the insulator layers S5 and S6. The capacitor C2a is located between the conductor layer provided on the insulator layer S5 and the conductor layer provided on the insulator layer S6.

The inductor L1a is located on the right half portions of the insulator layers S4 and S5. The inductor L1a has a structure in which the conductor layer provided on the insulator layer S4 and the conductor layer provided on the insulator layer S5 are connected by an interlayer connection conductor v2.

The inductor Lgb is located on the right half portions of the insulator layers S10 and S11. The inductor Lgb has a structure in which the conductor layer provided on the insulator layer S10 and the conductor layer provided on the insulator layer S11 are connected by an interlayer connection conductor v3.

The capacitor C1b is located on the left half portions of the insulator layers S7 and S8. The capacitor C1b is located between the conductor layer provided on the insulator layer S7 and the conductor layer provided on the insulator layer S8. The capacitor C2b is located on the left half portions of the insulator layers S7 and S6. The capacitor C2b is located between the conductor layer provided on the insulator layer S7 and the conductor layer provided on the insulator layer S6.

The inductor L1b is located in the right half portions of the insulator layers S7 and S8. The inductor L1b has a structure in which the conductor layer provided on the insulator layer S7 and the conductor layer provided on the insulator layer S8 are connected by an interlayer connection conductor V3. Note that the four corners of the insulator layers S1 to S12 are provided with interlayer connection conductors. The high pass filter 500 as described above is manufactured by, for example, repeatedly performing a photolithographic process.

In the high pass filter 500 as described above, the conductor layer provided on the insulator layer S5 serves as both the conductor layer serving as the capacitor C1a and the conductor layer serving as the capacitor C2a. Thus, an interlayer connection conductor for connecting the capacitor C1a to the capacitor C2a is unnecessary. As a result, the high pass filter 500 has a structure in which there is not an interlayer connection conductor other than the interlayer connection conductors provided in the inductors. Moreover, since the inductors L1a and L1b are positioned between the inductor Lga and the inductor Lgb, the layer gap between the coils can be increased while increasing the coupling coefficient between the inductor L1a and the inductor L1b, so that high Q of inductors can be realized.

Sixth Preferred Embodiment

In a sixth preferred embodiment, an example of an electronic device will be illustrated, the electronic device including a filter circuit device or a filter circuit module among the filter circuit devices or the filter circuit modules described above.

Figure 34:
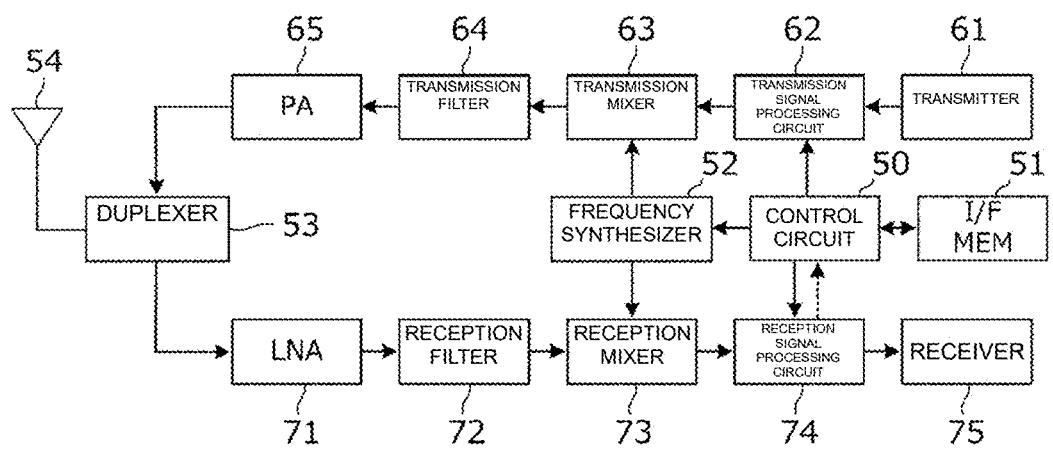
FIG. 34 is a block diagram illustrating the configuration of an electronic device 201 according to a sixth preferred embodiment of the present invention.

FIG. 34 is a block diagram illustrating the configuration of an electronic device 201 according to the sixth preferred embodiment. The electronic device 201 is, for example, a so-called smartphone or a cellular phone. The electronic device 201 includes a duplexer 53, an antenna 54, a control circuit 50, an interface and a memory 51, and a frequency synthesizer 52. The transmission system includes a transmitter 61, a transmission signal processing circuit 62, a transmission mixer 63, a transmission filter 64, and a power amplifier 65. The reception system includes a low noise amplifier 71, a reception filter 72, a reception mixer 73, a reception signal processing circuit 74, and a receiver 75. A transmission signal output from the power amplifier 65 is output to the antenna 54 via the duplexer 53. Moreover, a signal received by the antenna 54 passes through the duplexer 53 and is then amplified by the low noise amplifier 71. Note that in a case where a call is not made and data communication or the like is performed, the control circuit 50 processes a reception signal.

A filter or a filter module according to preferred embodiments of the present invention can be included in the transmission filter 64 or the reception filter 72. Moreover, a filter or a filter module according to preferred embodiments of the present invention can be included in a high frequency side filter of the duplexer 53.

Moreover, in a case where filters are provided, for example, before and after the power amplifier 65, before and after the low noise amplifier 71, before and after the transmission mixer 63, and before and after the reception mixer 73, filters or filter modules according to preferred embodiments the present invention can be included in these filters.

Current smartphones and cellular phones are used through a plurality of antennas or in a plurality of frequency bands, and thus many band pass filters or many wave separators are used. As these band pass filters or wave separators, for example, the band pass filter, the diplexer, the triplexer, or the multiplexer described in the fifth preferred embodiment can be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter comprising:
a first capacitor connected in series between a first terminal pair and a second terminal pair;
a first inductor connected in parallel with the first capacitor;
a second inductor connected in parallel between the first terminal pair and the second terminal pair; and
a multilayer body including a plurality of insulator layers; wherein
the filter includes a high pass filter characteristic between the first terminal pair and the second terminal pair;
the first inductor and the second inductor are magnetically coupled to each other and are differentially connected to each other;
the first inductor includes a first coiled conductor in the multilayer body;
the second inductor includes a second coiled conductor in the multilayer body;
the first capacitor includes first capacitor electrodes and an insulator layer among the plurality of insulator layers, the first capacitor electrodes facing each other in a stacking direction of the plurality of insulator layers;
the first coiled conductor includes a first coil cavity;
the second coiled conductor includes a second coil cavity;

a winding axis of the first coiled conductor is parallel or substantially parallel to that of the second coiled conductor;
the first coil cavity and the second coil cavity have an overlapping region when viewed in a direction of the winding axis;
a first end of the first inductor is connected to a first end of the second inductor; and
a second end of the second inductor is connected to ground.

2. The filter according to claim 1, wherein a coupling coefficient between the first inductor and the second inductor is greater than or equal to about 0.2.

3. The filter according to claim 1, further comprising:
a third inductor including an end connected to a point where the first inductor and the second inductor are connected to each other; wherein
a series circuit including the third inductor and the first inductor is connected in series between the first terminal pair and the second terminal pair.

4. An electronic device comprising:
the filter according to claim 1.

5. The filter according to claim 1, further comprising:
a second capacitor connected between the second terminal pair and the first capacitor.

6. The filter according to claim 5, wherein
the second capacitor includes second capacitor electrodes and an insulator layer among the plurality of insulator layers, the second capacitor electrodes facing each other in the stacking direction of the plurality of insulator layers;
the filter further comprising:
a wiring conductor connected in series between a second capacitor electrode among the second capacitor electrodes and the second terminal pair and located between the first coiled conductor and the second coiled conductor in the multilayer body.

7. The filter according to claim 6, wherein the wiring conductor has a conductor width smaller than that of at least one of the first coiled conductor or the second coiled conductor.

8. The filter according to claim 1, wherein the first coiled conductor and the first capacitor electrodes include continuous conductive patterns.

9. A filter module comprising:
the filer according to claim 1; and
a low pass filter or a band pass filter.

10. An electronic device comprising:
the filter module according to claim 9.

11. A filter module comprising:
the filter according to claim 1; and
a capacitor connected to a path connected to ground in a parallel manner from between the first terminal pair and the second terminal pair of the filter.

12. An electronic device comprising:
the filter module according to claim 11.

13. A filter module comprising:
the filter according to claim 1; and
an inductor connected in series between the first terminal pair and the second terminal pair of the filter.

14. An electronic device comprising:
the filtr module according to claim 13.

15. A filter comprising:
a first capacitor connected in series between a first terminal pair and a second terminal pair;
a second capacitor connected between the second terminal pair and the first capacitor;
a first inductor connected in parallel with the first capacitor;
a second inductor connected in parallel between the first terminal pair and the second terminal pair; and
a multilayer body including a plurality of insulator layers; wherein
the first inductor and the second inductor are magnetically coupled to each other and are differentially connected to each other;
the first inductor includes a first coiled conductor in the multilayer body;
the second inductor includes a second coiled conductor formed in the multilayer body;
the first capacitor includes first capacitor electrodes and an insulator layer among the plurality of insulator layers, the first capacitor electrodes facing each other in a stacking direction of the plurality of insulator layers;
the second capacitor includes second capacitor electrodes and an insulator layer among the plurality of insulator layers, the second capacitor electrodes facing each other in the stacking direction of the plurality of insulator layers; and
the filter further comprising:
a wiring conductor connected in series between a second capacitor electrode among the second capacitor electrodes and the second terminal pair and located between the first coiled conductor and the second coiled conductor in the multilayer body.

16. A filter comprising:
a first capacitor connected in series between a first terminal pair and a second terminal pair;
a first inductor connected in parallel with the first capacitor;
a second inductor connected in parallel between the first terminal pair and the second terminal pair; and
a multilayer body including a plurality of insulator layers; wherein
the first inductor and the second inductor are magnetically coupled to each other and are differentially connected to each other;
the first inductor includes a first coiled conductor in the multilayer body;
the second inductor includes a second coiled conductor in the multilayer body;
the first capacitor includes first capacitor electrodes and an insulator layer among the plurality of insulator layers, the first capacitor electrodes facing each other in a stacking direction of the plurality of insulator layers;
the first coiled conductor and the first capacitor electrodes include continuous conductive patterns;
a first end of the first inductor is connected to a first end of the second inductor; and
a second end of the second inductor is directly connected to ground.

* * * * *